(12) United States Patent
Shau

(10) Patent No.: US 6,835,974 B2
(45) Date of Patent: Dec. 28, 2004

(54) THREE DIMENSIONAL INTEGRATED CIRCUITS USING SUB-MICRON THIN-FILM DIODES

(76) Inventor: Jeng-Jye Shau, 3375 Scott Blvd., Suite 332, Santa Clara, CA (US) 95054

( * ) Notice: Subject to any disclaimer, the term of this patent is extended or adjusted under 35 U.S.C. 154(b) by 103 days.

(21) Appl. No.: 10/101,451

(22) Filed: Mar. 14, 2002

(65) Prior Publication Data

US 2003/0173669 A1 Sep. 18, 2003

(51) Int. Cl.[7] ................... H01L 31/062; H01L 31/113; H01L 20/76; H01L 29/94
(52) U.S. Cl. ...................................... 257/288; 257/328
(58) Field of Search ................................ 257/288, 328, 257/367, 518, 528, 577

(56) References Cited

U.S. PATENT DOCUMENTS

| | | | | |
|---|---|---|---|---|
| 4,779,127 A | * | 10/1988 | Honjo | 257/272 |
| 5,122,856 A | * | 6/1992 | Komiya | 257/774 |
| 5,340,762 A | * | 8/1994 | Vora | 438/207 |
| 5,744,853 A | * | 4/1998 | Quek et al. | 257/532 |
| 5,982,021 A | * | 11/1999 | Verma | 257/577 |
| 6,180,444 B1 | * | 1/2001 | Gates et al. | 438/237 |
| 6,501,111 B1 | * | 12/2002 | Lowrey | 257/295 |

* cited by examiner

Primary Examiner—S. V. Clark
(74) Attorney, Agent, or Firm—Bo-In Lin

(57) ABSTRACT

This invention provides practical methods to fabricate sub-micron 3D integrated circuits using multiple layers of diodes manufactured on polycrystalline or amorphous semiconductor thin films. The long existing problems for using poly diodes for high density IC are solved by design and manufacture methods. The circuit design methods of the present invention improve the tolerance in non-ideal properties of diodes. The resulting IC products can function correctly even when many of their diodes are defective. We also developed manufacture procedures fully compatible with current art IC technologies. No additional masking steps or high temperature procedures are used. The 3D IC devices of the present invention are ready to be manufactured by current art IC technologies. Integrated circuits with unprecedented densities are therefore realized by stacking thin film diodes upon common active devices.

8 Claims, 21 Drawing Sheets

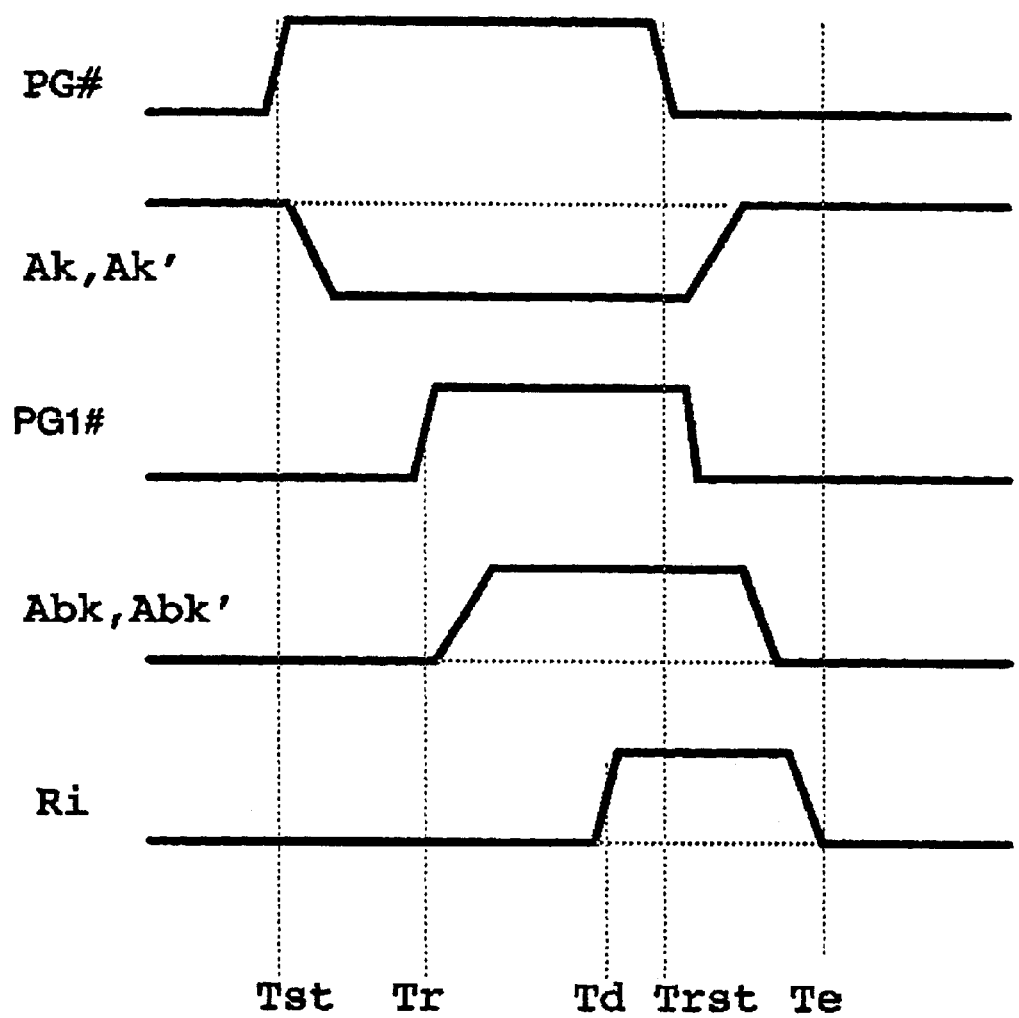

THREE DIMENSIONAL INTEGRATED CIRCUITS USING SUB-MICRON THIN-FILM DIODES

FIELD OF THE INVENTION

The present invention relates to methods to improve the density of high performance integrated circuit (IC), and more particularly to methods to improve circuit density by stacking active devices vertically using sub-micron thin-film diodes.

BACKGROUND OF THE INVENTION

A three-dimensional (3D) circuit described in the present invention is a circuit that can have more than one active device on the same substrate area. All integrated circuits of current art cannot have more than one active device in the same area. The most common active devices used by conventional IC are metal-oxide-silicon (MOS) transistors and bipolar transistors. The performance-sensitive regions of those devices are built on single crystal semiconductor substrates to achieve excellent quality control; millions of transistors can be manufactured while their properties are nearly identical. Because no more than one transistor can share the same substrate at the same time, it is impossible to build 3D circuits using such transistors. There were research efforts trying to build 3D circuits by growing multiple layers of single crystal thin films to build 3D circuits. However, building MOS transistors on such thin films with consistency is proven to be extremely difficult. To the best of our knowledge, none of those research efforts were successful.

The dominating active devices used for IC design are transistors. Diodes are seldom used by circuit designers for the difficulty to build a large number of diodes with consistency. Several inventions have been proposed to use Silicon diodes to manufacture read-only memory (ROM). For example, in U.S. Pat. No. 4,399,450 Lohstroh used silicon diodes to manufacture ROM. In U.S. Pat. No. 4,661,927, Graebel used Schottky diodes to manufacture programmable logic array (PLA) and ROM. In U.S. Pat. No. 5,550,075 Hsu et al. proposed a manufacture process to fabricate ROM using smaller diodes on silicon substrate. Vu describes diode-FET logic circuitry in U.S. Pat. No. 4,845,679, while Ogura et al. describes another PLA design in U.S. Pat. No. 4,659,947. The above inventions use diodes built on single crystal substrates. A single-crystal diode is not necessarily smaller than a MOS transistor. Conventional circuits using MOS transistors are better in performance, yield, and cost efficiency. There is no advantage to design IC using single crystal diodes. Such diodes are also not useful in building 3D circuits because they also use single crystal substrates.

Another approach is to use thin-film diodes manufactured by polysilicon or amorphous silicon thin-films. In U.S. Pat. No. 5,272,370 French described thin-film devices for ROM. Sung et al. described silicon diodes manufactured in the plugs of contacts. Such thin-film diodes occupy smaller area, but their quality is very difficult to control. Amorphous or polysilicon semiconductors are materials full of defects. Devices built on such defective materials are very far from ideal. Typically they have much larger reverse bias current than diodes built on single crystal substrates. Existing researches on polysilicon or amorphous silicon are done on large area devices. Large area thin-film diodes can behave with consistency because the effects of defects are averaged in a large area. For high-density IC using sub-micron active devices, it is extremely difficult to manufacture large number of sub-micron thin-film diodes with consistent properties. Since the defect density in each sub-micron diode is nearly unpredictable, the property of individual diode is therefore unpredictable. The diodes described by Sung et al. are extreme cases because those diodes are built within a plug contact hole. The grain sizes of the polysilicon in those sub-micron contact holes must be at deep sub-micron range. It is extremely difficult to have quality control on such devices. All the above inventions require special processing steps to fabricate the diodes. Those additional processing steps increase the total costs of the final products. The materials used to build those diodes require high temperature heat treatments. It is well known to the art that high temperature heat treatments cause problems to other devices on the IC. Due to these and many other problems, to the best of our knowledge, no high density IC has been manufactured successfully using the above prior art inventions.

SUMMARY OF THE INVENTION

The primary objective of this invention is, therefore, to provide practical methods to manufacture sub-micron 3D integrated circuits. Another objective is to provide improved thin-film diodes that can be manufactured with consistency. Another objective is to provide design methods to improve the tolerance to the non-ideal properties of thin film diodes. Another primary objective is to achieve the above objectives using fabrication procedures compatible with current art IC technologies.

These and other objectives are accomplished by design and manufacture methods according to the present invention. For simplicity the following descriptions refer the "polycrystalline or amorphous" thin films as "poly". To use poly diodes as active devices for high density IC, there are two major difficulties. The first difficulty is to build sub-micron thin-film diodes with consistency. The second difficulty is to build them without degrading other IC components. Thin-film diodes are manufactured on materials full of defects. It is extremely difficult to manufacture a large number of sub-micron thin-film diodes with consistent properties when the properties of such small devices are dominated by local defects. Therefore, fabrication procedures of the present invention are developed to make thin-film diodes less sensitive to local defects by moving its active region away from high defect density regions. In the mean time, we also describe design methods to improve tolerance in non-ideal diode properties. The numbers of diodes connected to each node are reduces. Tri-stated drivers are used to reduce the effect of reverse bias leakage. Combinations of fabrication and design improvements make it practical to build IC devices from poly thin film diodes. However, there is another barrier for practical implementation. Poly thin films require high temperature annealing as part of its fabrication procedure. Such high temperature procedures can affect important properties of other IC components, such as the punch-through voltages (Vpt) of sub-micron transistors or the electro-migration (EM) properties of metal lines. Introducing high temperature treatments to an IC fabrication technology requires detailed calibration and development efforts. The tremendous initial cost for the development effort is a major barrier for its implementation. Therefore, this invention discloses manufacture procedures fully compatible with current art IC technologies that does not use additional high temperature procedures and there is no need to use additional masks. This invention demonstrates that current art IC technologies are ready to manufacture the 3D IC devices. Integrated circuits with unprecedented densities can be realized by stacking thin film diodes with common MOS transistors. Device density of logic circuit is improved by nearly one order of magnitude.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

In order to reduce entry barrier, existing fabrication procedures are used to build thin film diodes. With minor modifications, most of current art IC technologies can fabricate 3D IC devices of the present invention. The description uses fabrication methods compatible to current art 4 layer poly two layer metal (4P2M) DRAM technologies as examples. The novel active devices with novel structures are built by individual fabrication procedures well known to the art. Because all the individual procedures used in different embodiments of this invention are well documented in the art, there is no need to describe exact details of those individual procedures. Instead, cross section diagrams are shown to illustrate novel device structures build by those well-known procedures. In order to reduce the complexity in those cross section diagrams, straight lines are shown to illustrate device structures without describing detailed topography.

One example of the fabrication procedures of the present invention comprise the following steps:

Masking step 1 (MS1): Define n-well area by n-well mask. Provide n-well doping by ion-implantation.

Masking step 2 (MS2): Define p-well area by p-well mask. Provide p-well doping by ion-implantation.

Figure 1A:
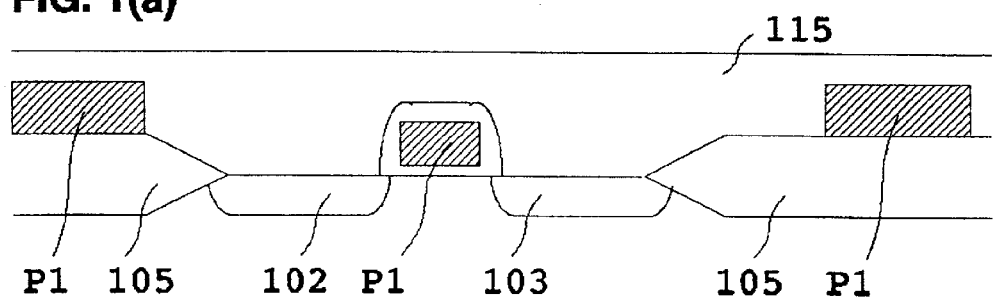
FIGS. 1(a–m) are cross-section diagrams illustrating the procedures to manufacture thin film diodes of the present invention using fabrication steps compatible to prior art dynamic random access memory (DRAM) technology.

Masking step 3 (MS3): Define active areas by active mask. Grow isolation field oxide. The symbolic structure of the filed oxide (105) is illustrated in FIG. 1(a).

Masking step 4 (MS4): Grow high quality thin-film insulator on the active area defined in MS3. Deposit the first layer poly thin film (P1). Define the poly thin film connections and transistor gate areas by P1 mask. For current art DRAM technology, P1 is often heavily doped with n-type dopant. To reduce the resistance of P1 connection lines, salicide is often grown on top of P1. A series of procedures, such as spacer deposition, are executed to define gate structures for MOS transistors.

Masking step 5 (MS5): Define the area for n-type diffusion by n+ mask. Ion implantation provides the n-type dopants. The source (102) and drain (103) areas for n-channel MOS transistors and n-type diffusion areas are defined in this masking step.

Masking step 6 (MS6): Define the area for p-type diffusion by p+ mask. Ion implantation provides the p-type dopants. The source and drain areas for p-channel MOS transistors and p-type diffusion areas are defined in this masking step. An interlayer dielectric (115) is deposited to provide insulation as illustrated in the cross-section diagram in FIG. 1(a). All the above procedures are well known to the art. The device structures are also identical to prior art devices up to this step. That is why we only use FIG. 1(a) to illustrate the resulting device structures for the above 6 masking steps. There is no need to describe them in further details.

Figure 1B:
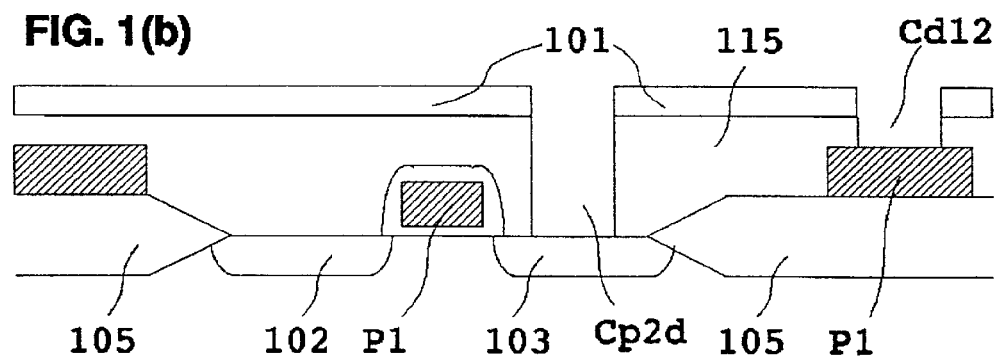
Figure 1C:
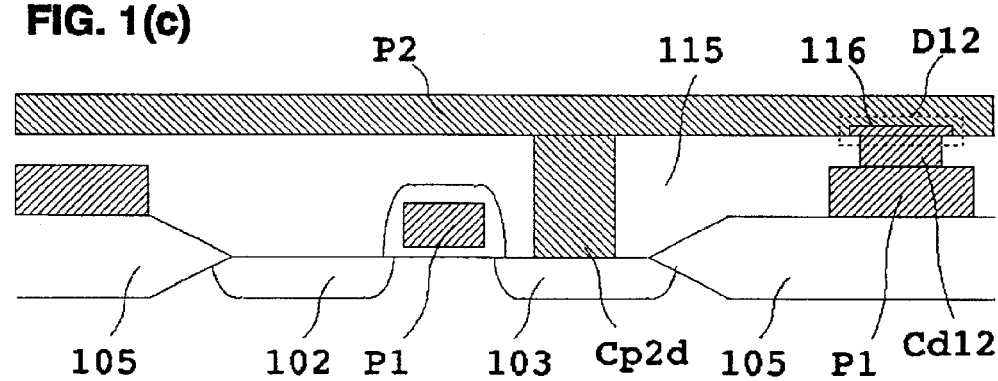

Masking step 7 (MS7): Define the contact area for the second layer poly thin film (P2) by P2C mask (101) as shown in FIG. 1(b). The contact holes are fabricated by selective plasma etching. After the mask is removed, the second layer poly thin film (P2) are deposited as shown in FIG. 1(c). P2 deposition is the first procedure that is different from prior art procedures. For a DRAM device, P2 is usually heavily doped n-type poly used for memory bit line connections; P2 contacts (Cp2d) are used for connections between bit lines and memory cells. For a 3D device of the present invention, P2 is doped with p-type dopants. The doping density is lower near the bottom of P2 layer, while it is heavily doped at the top. This doping profile can be achieved by low energy ion implantation as well known to the art. A layer of salicide may cover the top of P2 layer. There are two types of P2 contacts for 3D devices. The first type of P2 contact (Cp2d) connects P2 to diffusion area (102) on the substrate as shown in FIG. 1(c). Cp2d is an ohmic contact between P2 and p-type diffusion areas on the substrate, or a PN diode formed between P2 and n-type diffusion areas on the substrate. The second type of P2 contact (Cd12) connects P2 to P1. The n-type dopants from the heavily doped P1 diffuse toward lower doped P2 bottom layer. A thin film PN diode (D12) forms near the bottom of P2 as circled by dashed lines in FIG. 1(c). Comparing with prior art DRAM technology, the only change in this masking step is the doping profile of P2. There is no change in high temperature treatment. There is no change in geometry or masking steps.

Figure 1D:
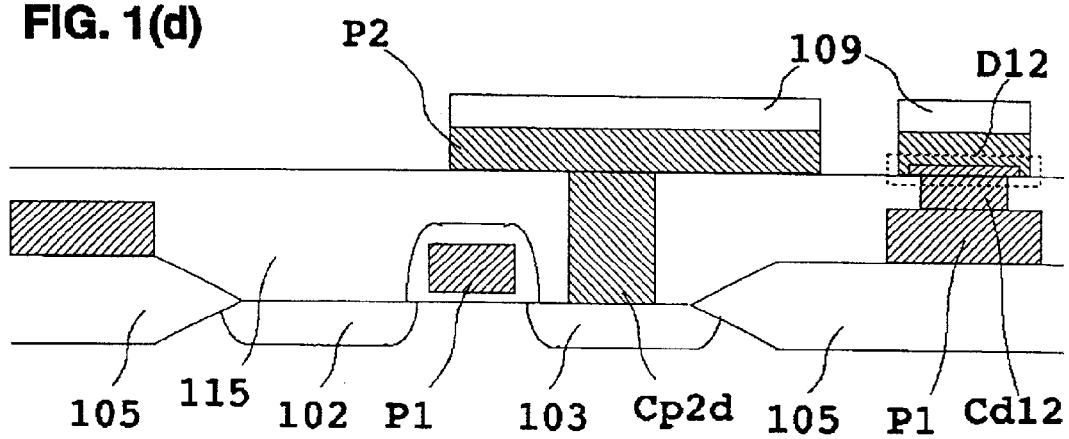
Figure 1E:
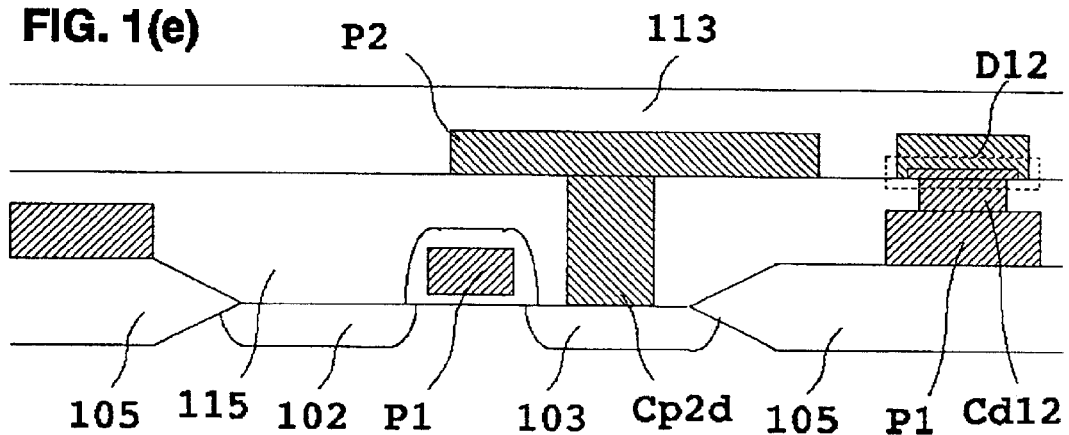

Masking step 8 (MS8): P2 area is defined by P2 mask (109) and etching procedures as shown in FIG. 1(d). After the photo resist is removed, another interlayer dielectric (113) is deposited to provide insulation as shown in FIG. 1(e).

Figure 1F:
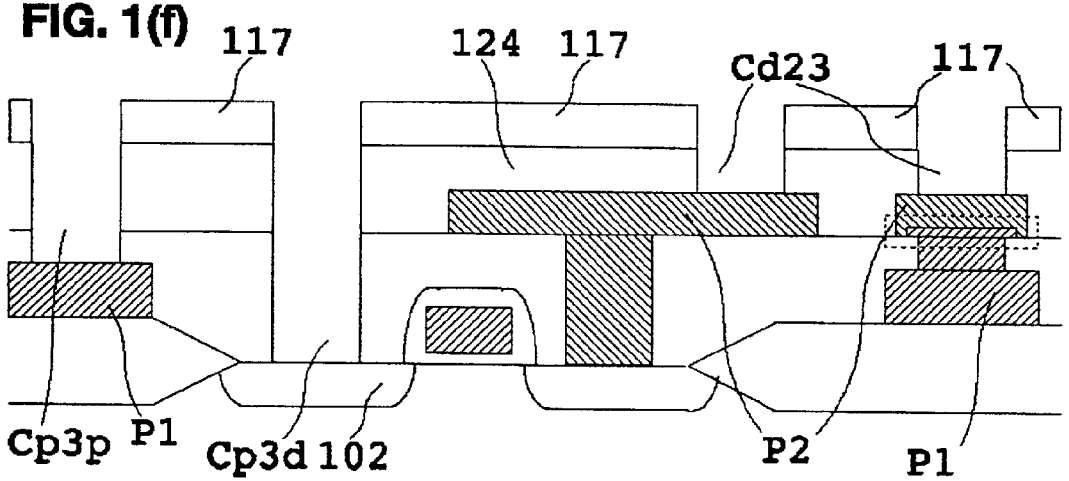
Figure 1G:
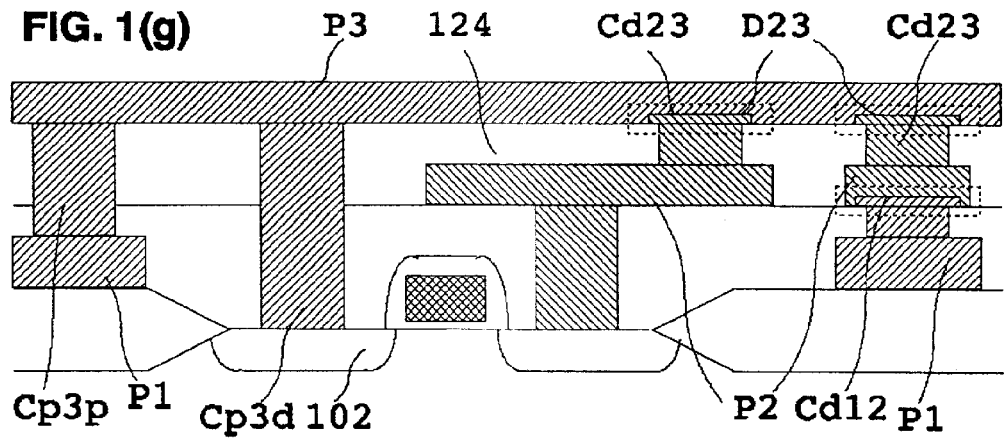

Masking step 9 (MS9): Define the contact area for the third layer poly thin film (P3) by P3C mask (117), and the contact holes are fabricated by selective plasma etching as shown in FIG. 1(f). After the mask is removed, the third layer poly thin film (P3) are deposited as shown in FIG. 1(g). For a DRAM device, P3 is usually heavily doped n-type poly as bottom electrode for memory cell storage capacitors; DRAM only use one type of P3 contact (Cp3d) for connections between memory cell storage capacitors and the drains of word line transistors. For a 3D device of the present invention, P3 is also n-type poly silicon. It is heavily doped near the top and lower doped near the bottom. We have three types of P3 contacts. The first type of P3 contact (Cp3d) connects P3 to substrate diffusion (102) as shown in FIG. 1(g). If the substrate diffusion (102) is n-type, Cp3d is an ohmic contact. If the substrate diffusion (102) is p-type, Cp3d provides a PN diode. The second type of P3 contact (Cp3p) connects P3 to P1 as inter-layer connection. The third type of P3 contact (Cd23) connects P3 to P2. P3 bottom layer is lightly doped n-type poly, while P2 top layer is heavily doped p-type poly. The p-type dopants in P2 diffuse into P3 to form a PN diodes (D23) near the bottom of P3 as circled by dashed lines in FIG. 1(g). Locations (124) between P2 and P3 without Cd23 contacts represent different binary data relative to locations with D23 diodes. All three types of P3 contacts (Cp3d, Cp3p, and Cd23) are manufactured simultaneously using the same masking step with the same procedures as prior art technology. The above procedures are therefore still compatible with prior art IC technology.

For a DRAM device, the next step is to grow a thin layer of insulator, and deposit P4 to form storage capacitor. We will use P4 as another layer of poly thin film for building another layer of thin-film diodes.

Figure 1H:
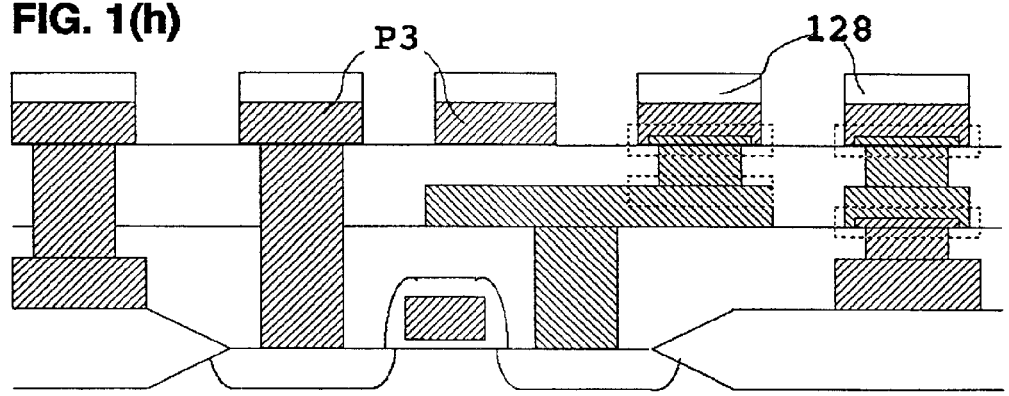
Figure 1I:
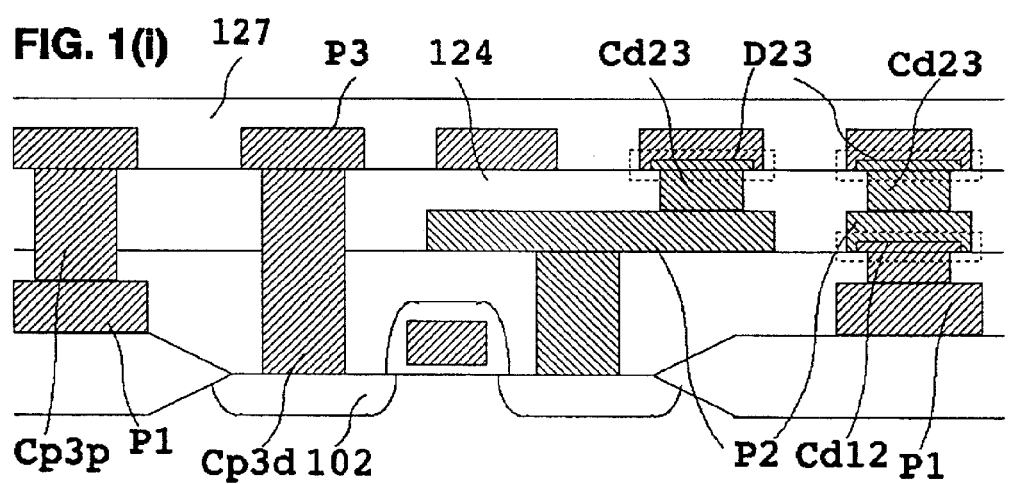

Masking step 10 (MS10): P3 areas are defined by P3 mask (128) and etching procedures as shown in FIG. 1(h). After the etching procedures, another interlayer dielectric (127) is deposited to provide insulation as shown in FIG. 1(i). This interlayer dielectric (127) does not exist in normal DRAM devices.

Figure 1J:
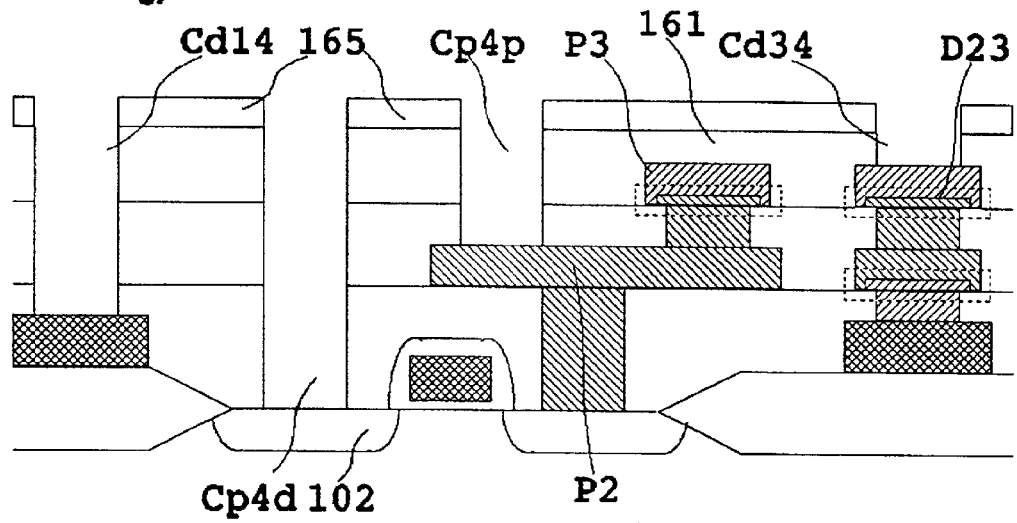
Figure 1K:
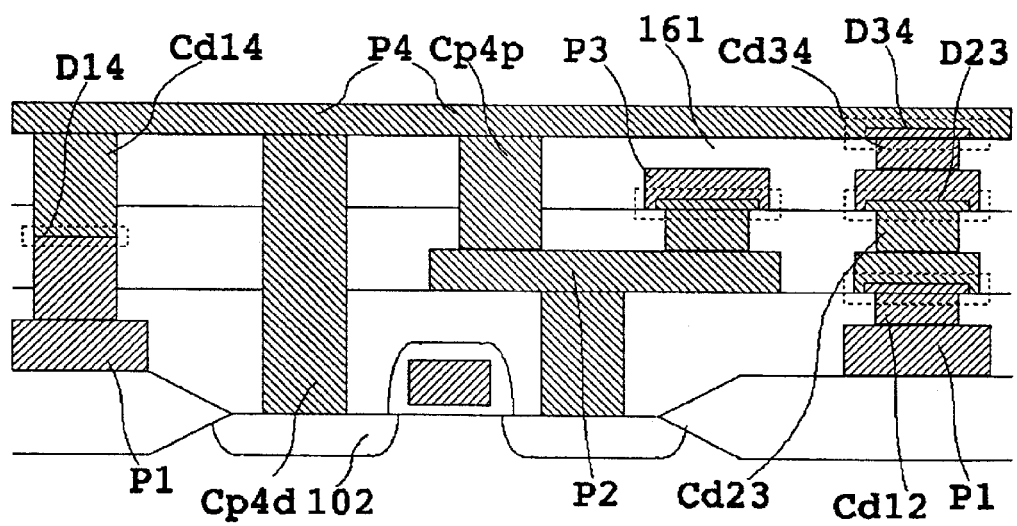

Masking step 11 (MS11): Define the contact area for the forth layer poly thin film (P4) by P4C mask (165), and the contact holes are fabricated by selective plasma etching as shown in FIG. 1(j). After the mask is removed, the forth layer poly thin film (P4) are deposited as shown in FIG. 1(k). This P4 layer is a p-type thin film heavily doped near the top while lower doped at the bottom. There are four types of P4 contacts The first type of P4 contact (Cp4d) connects P4 to substrate diffusion (102) as shown in FIG. 1(k). If the substrate diffusion (102) is p-type, Cp4d is an ohmic contact. If the substrate diffusion (102) is n-type, Cp4d provides a PN diode. The second type of P4 contact (Cd14) connects P4 to P1 to form a PN diode (D14) in the middle of the contact as circled by dashed lines in FIG. 1(k). The third type of P4 contact (Cp4p) connects P4 to P2 as interlayer connection. The forth type of P4 contact (Cd34) connects P4 to P3. P3 top layer is heavily doped n-type poly, while P4 bottom layer is lower doped p-type poly. The n-type dopants in P3 diffuse into P4 to form PN diodes (D34) near the bottom of P4 as circled by dashed lines in FIG. 1(k). The locations (161) between P3 and P4 without Cd34 contacts represent different binary data relative to the locations with D34 diodes. All four types of P4 contacts (Cp4d, Cd14, Cp4p, and Cd34) are manufactured simultaneously using the same masking step with the same procedures as prior art technology.

Figure 1L:
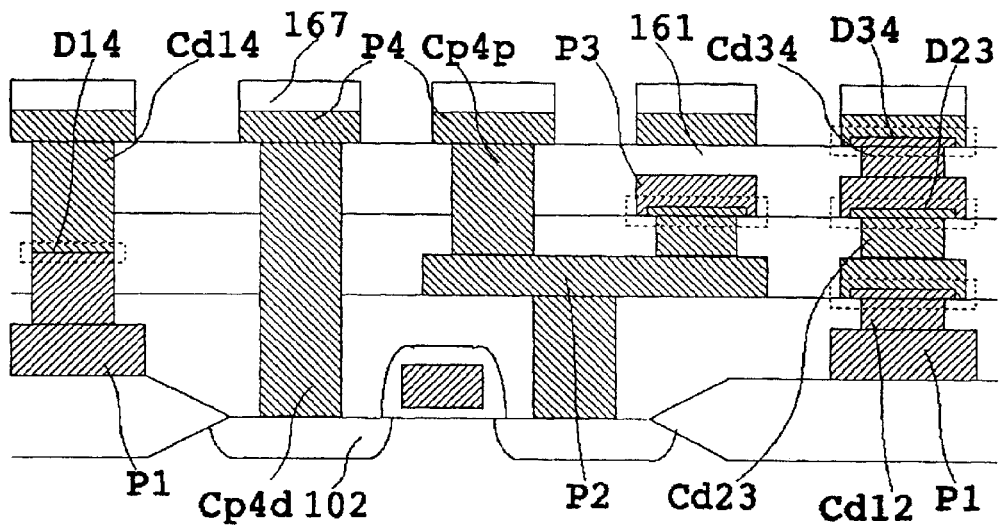
Figure 1M:
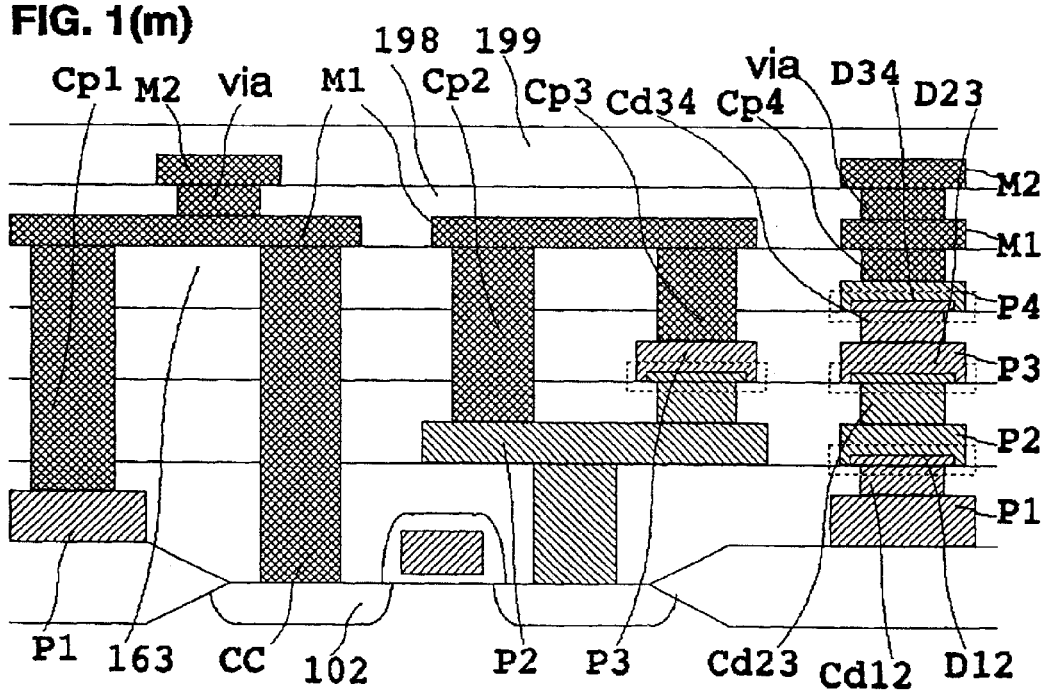

Masking step 12 (MS12): P4 areas are defined by P4 mask (167) and etching procedures as shown in FIG. 1(l). After this step, all the remaining procedures are identical to prior art procedures well known to the art. For simplicity, we will use one cross-section diagram to illustrate the geometry of 3D device after all the procedures are finished as shown in FIG. 1(m). After the etching procedures, another interlayer dielectric (163) is deposited to provide insulation.

Masking step 13 (MS13): Define the contact area for the first layer metal (M1) by contact mask, and the contact holes are fabricated by selective plasma etching using silicon as stopper. After the mask is removed, the first layer metal (M1) is deposited. There are five types of M1 contacts: the diffusion contacts (CC) connect M1 to substrate diffusion areas (102) and the poly contacts (Cp4–Cp1) connect M1 to poly layers (P4–P1), as shown in FIG. 1(m). All five types of M1 contacts (CC, Cp4–Cp1) are manufactured simultaneously using the same masking step with the same procedures as prior art technology. All of them are ohmic contacts.

Masking step 14 (MS14): M1 areas are defined by M1 mask and etching procedures. After the etching procedures, another interlayer dielectric (198) is deposited to provide insulation.

Masking step 15 (MS15): Define the contact area for the second layer metal (M2) by via mask, and the contact holes are fabricated by selective plasma etching using M1 as stopper. After the mask is removed, the second layer metal (M2) are deposited. The only M2 contact allowed in current art IC connects M2 to M1, and it is called a "via".

Masking step 16 (MS16): M2 areas are defined by M2 mask and etching procedures. After the etching procedures, a water-resist insulator (199) is deposited to provide insulation and protection.

The above manufacturing procedures of the present invention have the following advantages:

(1) The diodes Cd23 and Cd34 can be placed on top of the active areas of MOS transistors. Multiple layers of diodes (Cdl2, Cd23, Cd34) can be stacked on top of one another. These 3D structures allow us to achieve unprecedented device density.

(2) All the procedures used by the present invention are the same procedures used by the prior IC technologies. We use fabrication methods well known to the art to build novel 3D IC.

(3) The same masking steps used to define conventional contacts are used to define the locations of thin film diodes. The numbers of masking steps are identical to prior art IC fabrication technologies.

(4) The same poly thin film used by prior art IC technologies are used to build thin film diodes. There are no changes in high temperature treatments because we do not need additional poly layers.

While specific embodiments of the invention have been illustrated and described herein, it is realized that other modifications and changes will occur to those skilled in the art. It should be understood that the above particular examples are for demonstration only and are not intended as limitation on the present invention. For example, the doping profile or the type of dopants in each poly layer can be changed. The complexity of the procedure can be reduced significantly using fewer layers of poly thin films. The thin film diodes of the present invention can co-exist with a DRAM if we have fewer layers of diodes. These and other modifications and changes still fall within the spirit and scope of the invention.

Figure 2A:
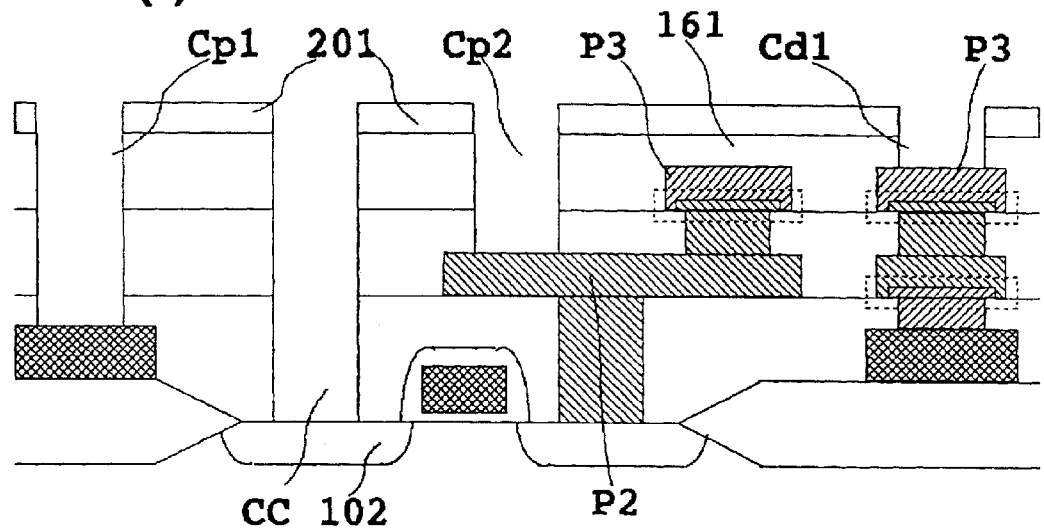
FIGS. 2(a–f) are cross-section diagrams illustrating another set of procedures to manufacture thin film diodes of the present invention using a modified DRAM technology.

In order to demonstrate the flexibility of the present invention, we will describe another set of fabrication procedures based on a modified 4P2M technology. The difference between these two examples is that the previous example deposits M1 after P4, while this modified method deposits M1 before P4. This change in sequence improves device density significantly. We will not repeat the first ten masking steps (Ms1–MS10) because they are identical between the two examples. The only exception is that P3 is not heavily doped at the top for this modified method. After the first 10 masking steps, the fabrication procedures comprise the following steps:

Masking step 11' (MS11'): Starting from the geometry illustrated in FIG. 1(i), we will deposit M1 instead of P4. Define the contact area for the first layer metal (M1) by contact mask (201), and the contact holes are fabricated by selective plasma etching as shown in FIG. 2(a). After the mask is removed, the first layer metal (M1) is deposited.

Figure 2B:
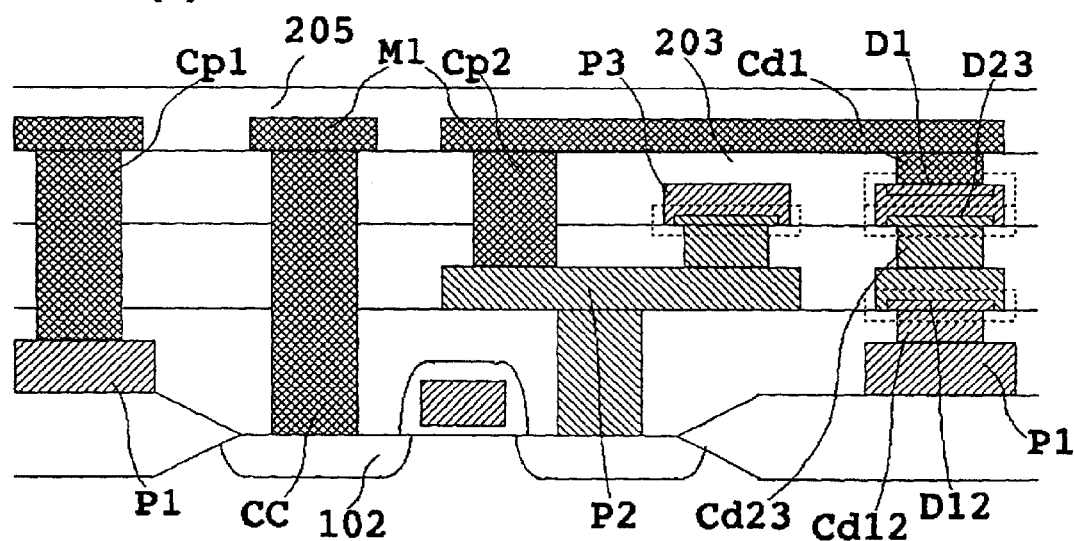

Masking step 12' (MS12'): M1 areas are defined by M1 mask and etching procedures. After the etching procedures, a layer of interlayer dielectric (205) is deposited to provide insulation. The structure at the end of this masking step is shown in FIG. 2(b). There are four types of M1 contacts made in this masking step. The diffusion contact (CC) connects M1 to substrate diffusion area (102). The P1 contact (Cp1) is an ohmic contact between M1 and P1. The P2 contact (Cp2) is an ohmic contact between M1 and P2. The above three types of contacts are well known to the art. The M1 to P3 contact (Cd1) forms a Schottky diode (D1) near the bottom of the contact as circled by dashed lines in FIG. 2(b). The top of P3 layer is lightly doped n-type material. It is known to the art that the interface between aluminum and lightly doped n-type silicon forms rectifying diode, if the interface is properly treated. The positions between M1 and P3 that do not have contacts (203) represent different binary data relative to those with contacts. All four types of M1 contacts (CC, Cp2, Cp1, Cd1) are manufactured simultaneously using the same masking step with the same procedures as prior art technology.

Figure 2C:
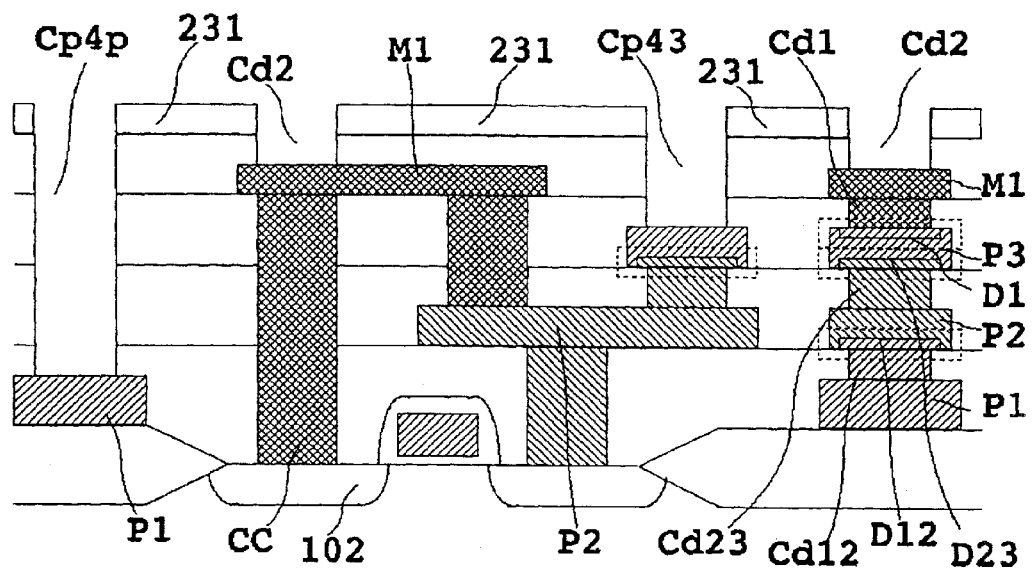

Masking step 13' (MS13'): Define the contact area for the forth layer poly thin film (P4) by P4 contact mask (231), and the contact holes are fabricated by selective plasma etching, as shown in FIG. 2(c). After the mask is removed, the forth layer poly thin film (P4) is deposited.

Figure 2D:
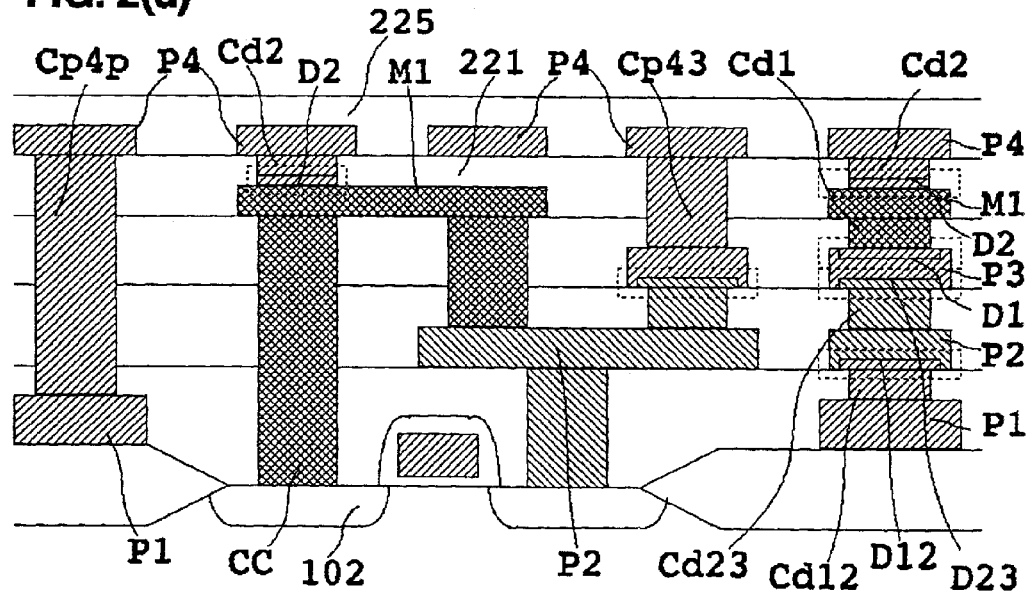

Masking step 14' (MS14'): P4 areas are defined by P4 mask and etching procedures. After the etching procedures, a layer of interlayer dielectric (225) is deposited to provide insulation. This P4 layer is lightly doped n-type poly thin film. The structure at the end of this masking step is shown in FIG. 2(d). There are three types of P4 contacts in this process flow. The first type of P4 contact (Cp4p) connects P4 to P1 as interlayer connection. The second type of P4 contact (Cp43) connects P4 to P3 as interlayer connection. The third type of P4 contact (Cd3) connects P4 to M1 to form a Schottky diode (D3) at the bottom of the contact, as circled by dashed lines in FIG. 2(d). The positions between M1 and P4 that do not have contacts (221) represent different binary data relative to those with contacts. All three types of P4 contacts (Cp4p, Cp43, Cd2) are manufactured simultaneously using the same masking step with the same procedures as prior art technology. The major difference is that this poly layer is deposited after M1 deposition.

Figure 2E:
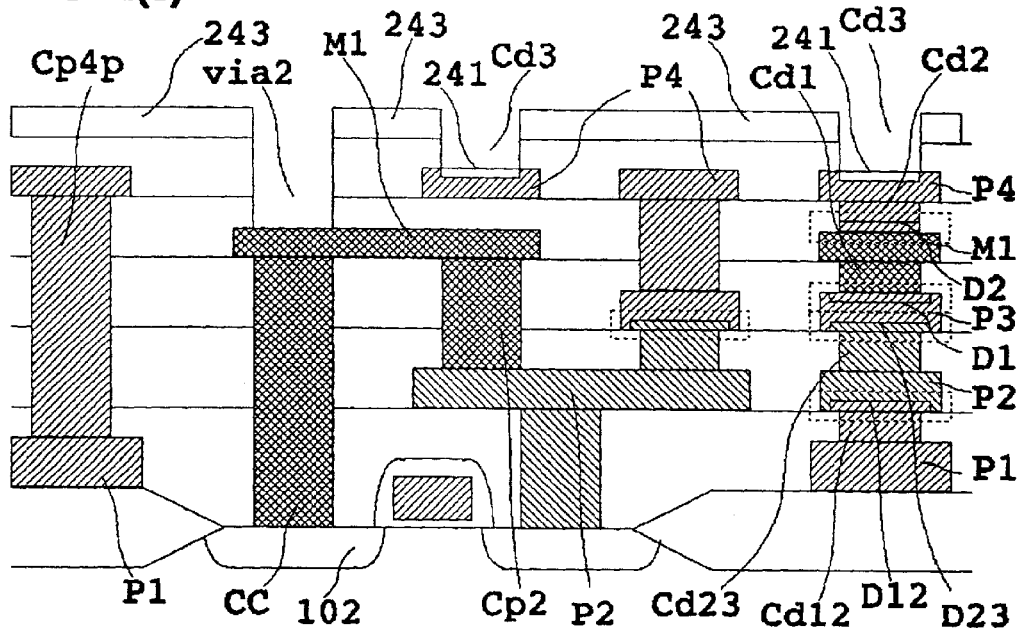

Masking step 15' (MS15'): Define the contact areas for the second layer metal (M2) by via mask (234), and the contact holes are fabricated by selective plasma etching using silicon as stopper, as shown in FIG. 2(e). After the mask is removed, the second layer metal (M2) is deposited.

Figure 2F:
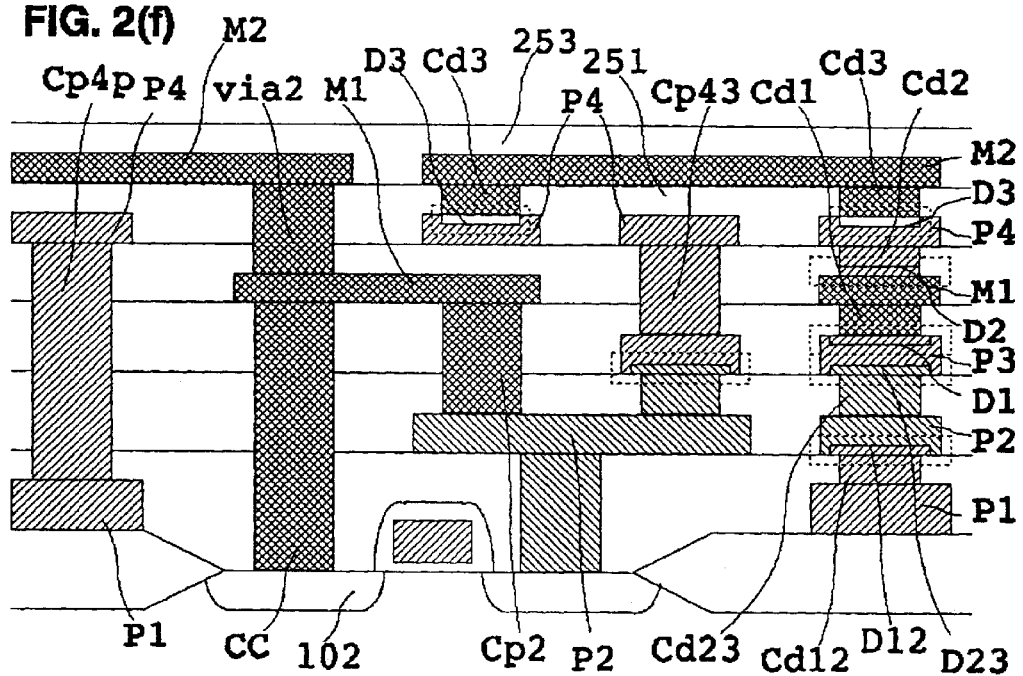
Figure 3A:
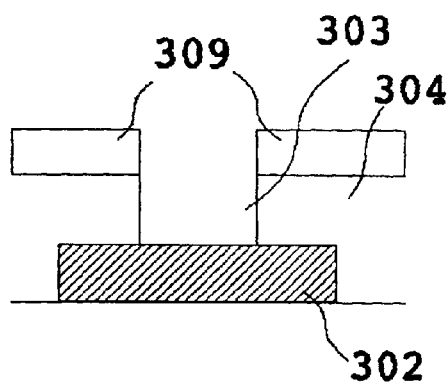
FIGS. 3(a–e) are cross-section diagrams illustrating the procedure to manufacture a thin film diode between two poly layers.
Figure 3B:
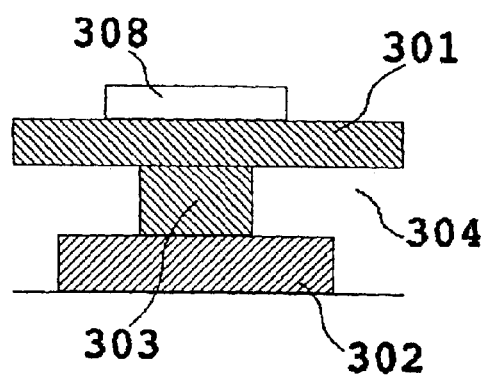
Figure 3C:
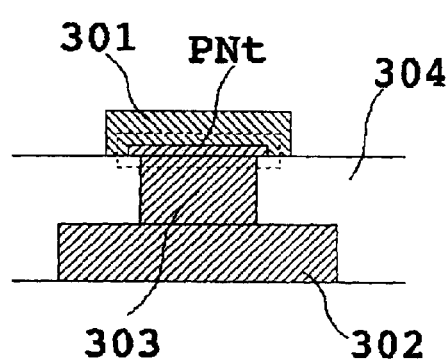
Figure 3D:
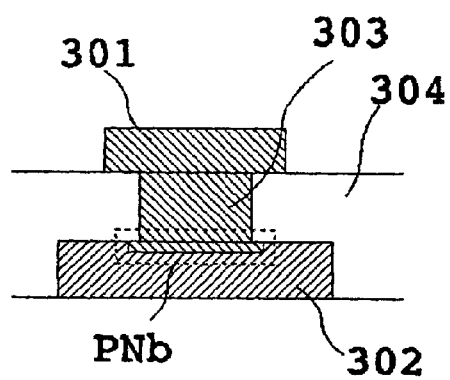
Figure 3E:
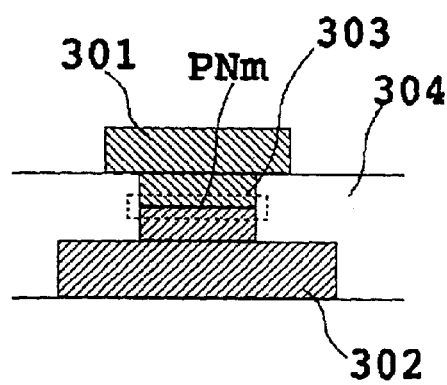
Figure 4A:
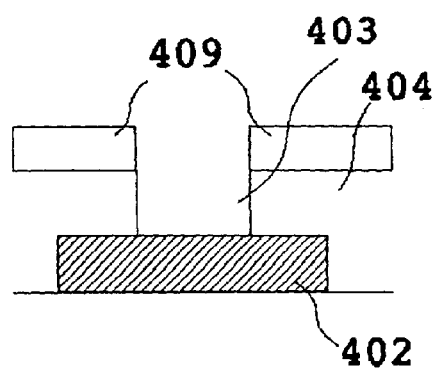
FIGS. 4(a–e) are cross-section diagrams illustrating the procedures to manufacture a thin film diode when the bottom layer is poly and the top layer is metal.
Figure 4B:
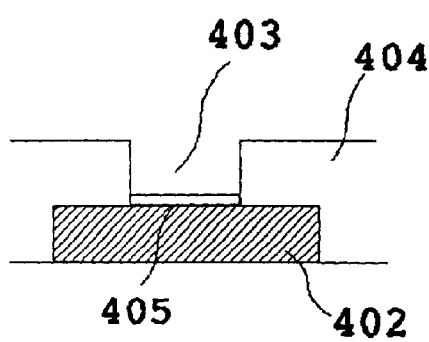
Figure 4C:
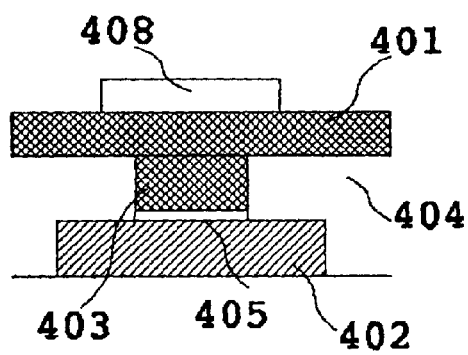
Figure 4D:
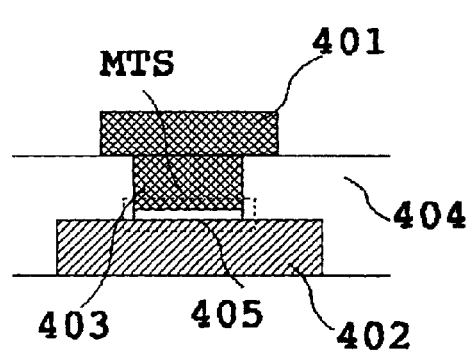
Figure 4E:
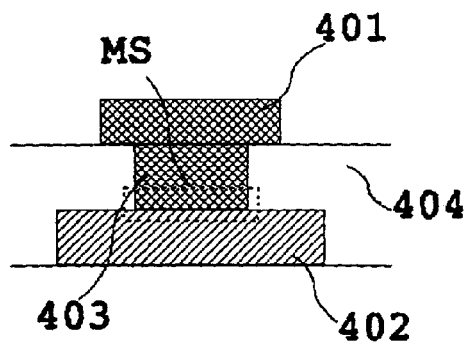
Figure 5A:
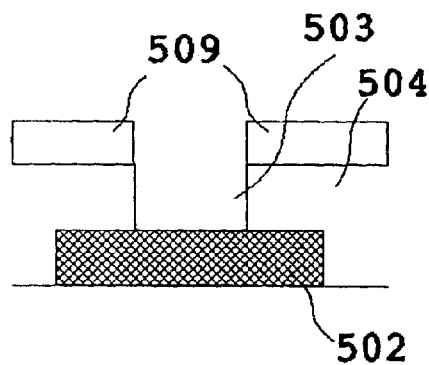
FIGS. 5(a–e) are cross-section diagrams illustrating the procedures to manufacture a thin film diode when the bottom layer is metal and the top layer is poly.
Figure 5B:
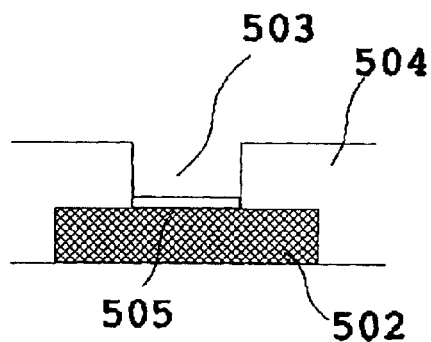
Figure 5C:
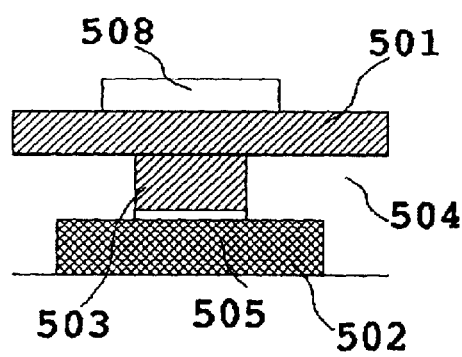
Figure 5D:
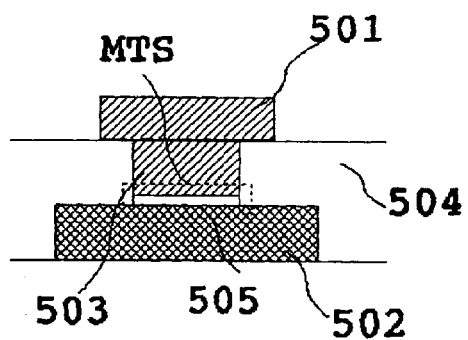
Figure 5E:
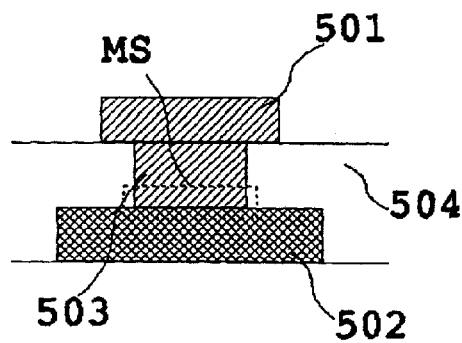

Masking step 16' (MS16'): M2 areas are defined by M2 mask and etching procedures. After the etching procedures, a layer of water-resist insulator (253) is deposited to provide insulation and protection. The structure at the end of this masking step is shown in FIG. 2(f). There are two types of M2 contacts in this process flow. The contact connects M2 and M1 is called "via" as well known to the art. The M1 to P4 contact (Cd3) forms a Schottky diode (D3) near the bottom of the contact as circled by dashed lines in FIG. 2(f). It is also possible to grow a thin layer of tunneling oxide (241) between M2 and P4 as shown in FIG. 2(e). The thickness of the tunneling oxide is between 1 to 3 nm. In this way, the diode between M2 and P4 is a metal-tunneling oxide-semiconductor (MTS) diode. Both types of M2 contacts (via, Cd3) are manufactured simultaneously using the same masking step with the same procedures as prior art technology.

This set of fabrication procedures allows us to stack 4 layers of thin film diodes (D3, D2, D1, D23) on top of MOS transistor active areas. It can achieve extremely high device density. The Schottky diodes or MTS diodes are faster than PN diodes. The resulting products have better performance. It still has the same advantages as previous examples. The major disadvantage is that M1 will experience high temperature treatment used for P4 annealing. Such heat treatment may cause electro-migration (EM) problem on M1 if not carefully calibrated.

FIGS. 3–5 describe the procedures to fabricate individual thin film diodes in further details. To fabricate a thin film diode between two poly thin films, the first step is to open a contact (303) on top of the bottom layer poly thin film (302) as shown in FIG. 3(a). The contact area is defined by contact mask photo resist (309). After the photo resist is removed, top layer poly thin film (301) with opposite doping is deposited as shown in FIG. 3(b). The contact area (303) is filled with this top layer poly material. Another mask (308) is used to define the area of the top layer poly thin film (301). During heat treatment, dopants in both layers of poly thin films (301, 302) diffuse through the contact area (303). If the doping in the bottom layer (302) is heavier than that of the top layer (301), a PN diode (PNt) forms in the top layer (301) as shown in FIG. 3(c). The sheet resistance of the top layer poly (301) increases because the depletion region of the diode reduces its conductive area. Examples of PNt diodes (D34, D23, D12) are shown in FIG. 1(m). This type of diode is desirable when the bottom layer poly thin film (302) is covered with salicide. If the doping in the top layer (301) is heavier than that of the bottom layer (302), a PN diode (PNb) forms in the bottom layer (302) as shown in FIG. 3(d). The sheet resistance of the bottom layer poly increases because the depletion region of the diode reduces its conductive area. If the depth of the contact (303) is longer than diffusion distance, or if the doping on both layers is equivalent, a PN diode (PNm) may form in the middle of the contact as shown in FIG. 3(e). The defect densities of the poly materials in the contact areas are higher than those in the planar areas. The PNm diode is therefore more likely to be defective. On the other hand, it has less influence on the resistance of both conductive layers (301, 302). One example of PNm diode (D14) is shown in FIG. 1(k).

FIGS. 4(a–e) illustrate the procedures to fabricate thin film diodes when the bottom layer is a poly thin film while the top layer is metal. The first step is to open a contact hole (403) defined by contact mask (409) as illustrated in FIG. 4(a). After the photo resist (409) is removed, a tunneling insulator (405) is grown at the bottom of the contact (403). Metal thin film (401) is then deposited, and its area is defined by metal mask (408) as shown in FIG. 4(c). A metal-tunneling insulator-semiconductor (MTS) diode is then formed as shown in FIG. 4(d). If we do not grow tunneling insulator, a Schottky diode (MS) is formed as shown in FIG. 4(e). The MTS diode is more consistent in its reverse bias properties than the Schottky diode, but it tends to have less forward bias current.

FIGS. 5(a–e) illustrate the procedures to fabricate thin film diodes when the bottom layer is a metal while the top layer is poly thin film. The first step is to open a contact hole (503) defined by contact mask (509) as illustrated in FIG. 5(a). After the photo resist (509) is removed, a tunneling insulator (505) is grown at the bottom of the contact (503). Poly thin film (401) is then deposited, and its area is defined by poly mask (508) as shown in FIG. 5(c). A metal-tunneling insulator-semiconductor (MTS) diode is then formed as shown in FIG. 5(d). The tunneling insulator in FIG. 5(b) is grown on metal, which is not a well-known procedure in current art IC technology. If we do not grow tunneling insulator, a Schottky diode (MS) is formed as shown in FIG. 5(e).

Figure 6:
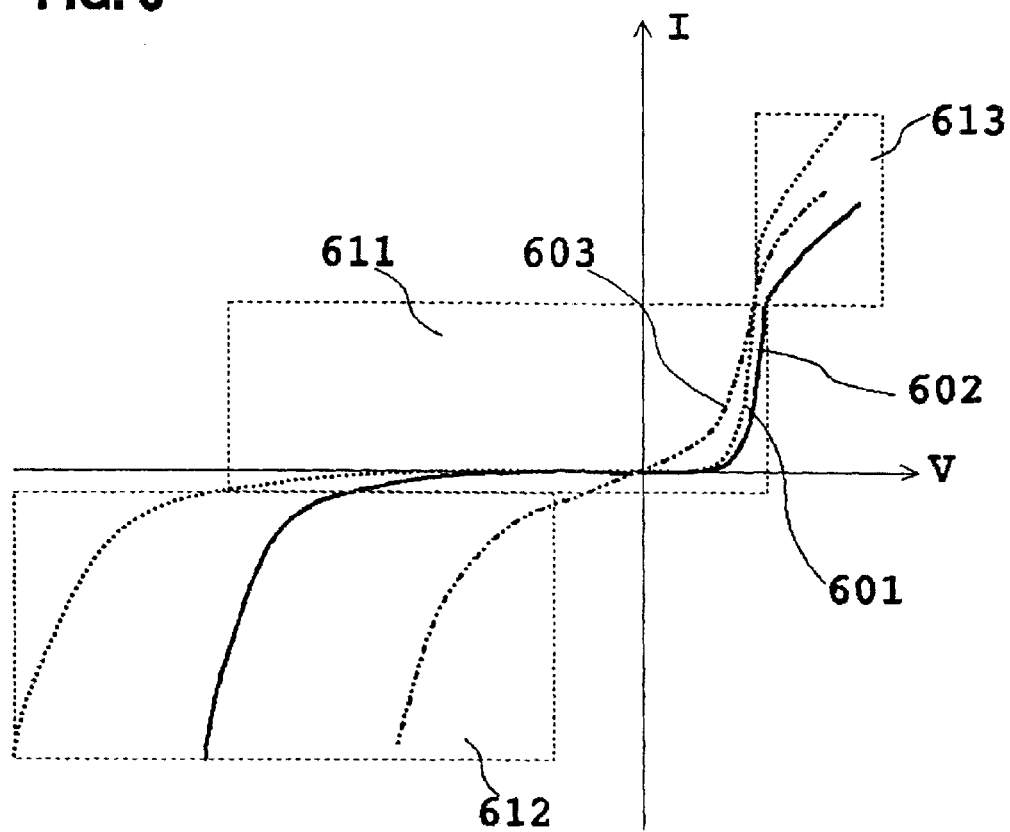
FIG. 6 shows the current-voltage (IV) relationship of non-ideal diodes.

Thin-film diodes are manufactured on materials full of defects. Properties of these thin film diodes are therefore often very far from ideal. FIG. 6 illustrates realistic current-voltage (IV) relationships of these non-ideal diodes. The dashed line (601) in FIG. 6 shows a typical IV relationship of a diode manufactured on semiconductor substrate; the solid line (602) in FIG. 6 shows that of a thin film diode. These IV relations can be divided into three regions of different behaviors: the rectifying region (611), the reverse bias breakdown region (612), and the non-ideal forward bias (613) region as shown in FIG. 6. In the rectifying region (611), the diodes behave similar to an ideal diode; the forward bias current increase exponentially with voltage while the reverse bias current is very small. In the reverse bias breakdown region (612), the reverse bias currents start to increase rapidly with voltage. In the non-ideal forward bias region (613), the forward bias current no longer increase exponentially with bias voltage because series resistance starts to dominate the IV behavior. The thin film diodes (602) tend to have smaller rectifying region, as shown in FIG. 6. On the other word, thin film diodes tend to have larger reverse bias leakage current, and slightly smaller forward bias current. An example of the IV relationship of a defective diode (603) is also shown as the double dash line in FIG. 6. This defective diode does not have a clear rectifying behavior. Usually, defective diodes can be modeled as a diode with small breakdown voltage and a parallel leaking resistor. Thin film diodes tend to have higher chance to be defective.

Current art IC design methodologies assume there is an excellent consistency in circuit elements. The products designed by such design methodologies would have poor yield if any one of the fundamental circuit element is not near perfect. To design IC using those non-ideal thin film diodes, we must develop novel circuit design methods to improve the tolerance in non-ideal diode properties. Circuit design examples in the following sections demonstrate the problems and the solutions of 3D IC of the present invention.

Figure 7A:
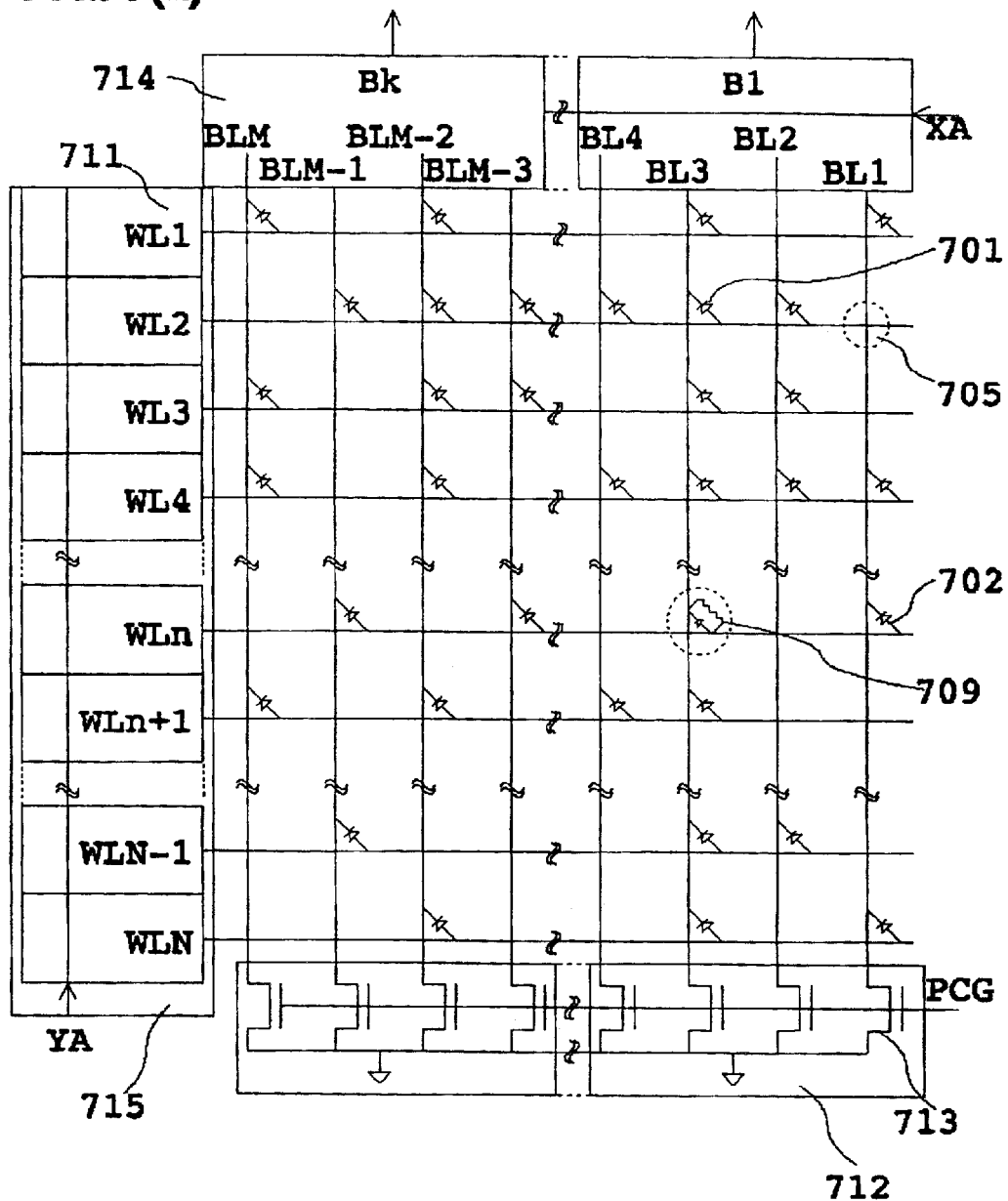
FIGS. 7(a–f) describe the circuit design methods for a read-only-memory (ROM) of the present invention.
Figure 7B:
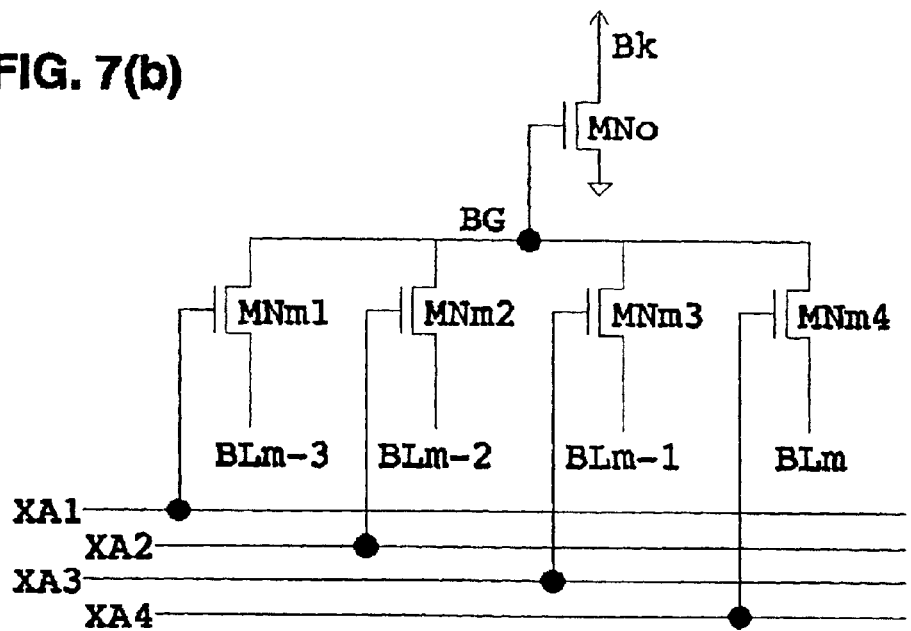

FIG. 7(a) shows the schematic diagram of a read-only memory (ROM) sub-array. This ROM sub-array comprises N word lines (WL1, WL2, É, WLn, É, WLN) and M bit lines (BL1, BL2, É, BLm, É, BLM) where N, M, n, m are integers. Thin film diodes (701, 702) are placed at interactions between those word lines and bit lines. An intersection with diode (701, 702) represents one binary state while an intersection without diode (705) represents the other binary state. Each word line is driven by a decoder element (711) of a decoder (715). Bit lines are connected to output circuits (714) and pre-charge circuits (712). The pre-charge circuits (712) are controlled by a pre-charge signal (PCG). When the ROM array is idle, PCG is activated to turn on the transistors (713) in the pre-charge circuits (712) to set the voltages of bit lines to ground voltage (Vss). Details of the output circuits (714) are illustrated in FIG. 7(b). Each bit line (BLm, BLm-1, BLm-2, BLm-3) is connected to the source of one bit line select transistor (MNm4–MNm1); the gate of each select transistor is controlled by one bit line select signal (XA4–XA1) as shown in FIG. 7(b). These bit line select signals (XA4–XA1) are mutually exclusive so that one and only one of them is activated at any time. The drains of all select transistors are connected together to the gate (BG) of an output transistor (MNo). The source of the output transistor (MNo) is connected to ground voltage Vss, while its drain is connected to the next level bit line (Bk).

Figure 7C:
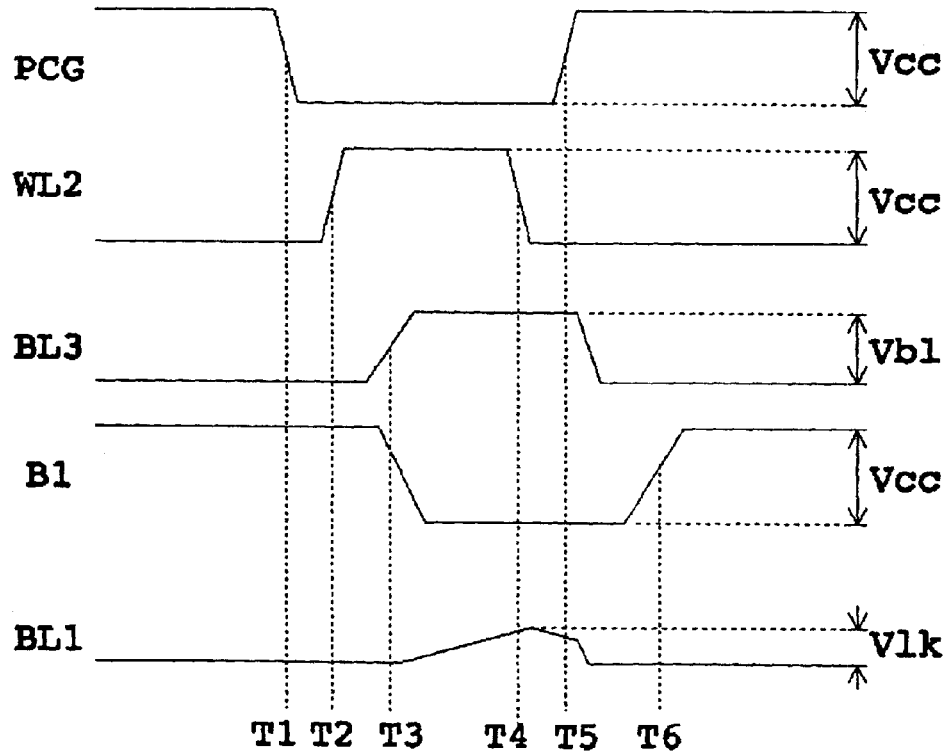

FIG. 7(c) shows the timing relationships between critical signals of the ROM sub-array. Before time T1, the ROM sub-array is idle; pre-charge signal PCG is active, so that all word lines and bit lines are pre-charged to Vss. The next level bit lines (B1 in this example) are pre-charged to power supply voltage (Vcc) by their own pre-charge circuits (not shown). For simplicity, we will show the waveforms on one activated word line (WL2 in this example) and two bit lines (BL3, BL1) in FIG. 1(c). The first step for reading the ROM is to deactivate the pre-charge signal (PCG) at time T1 as shown in FIG. 7(c). Shortly after PCG is deactivated, one of the word lines (WL2 in this example) is activated at T2. All the diodes connected to the activated word line (WL2) are forward biased. The voltage on the activated word line (WL2) propagates to those bit lines (BL2, BL3, BL4, BLM-3, BLM-2, BLM-1) with diodes connected to it. The voltages of those bit lines (BL1, BLM) with no diodes connected to the activated word line (WL2) should remain at Vss. The bit line select transistors (MN4–MN1) in the output circuits (714) select a sub-set of the signals in the bit lines (BL1-BLM), and propagate the selected signals to the next level bit line (B1, Bk). To end this read operation, the activated word line (WL2) is deactivated at time T4, and PCG is activated at time T5. All the other signals return to their idle states after PCG is activated.

Figure 7D:
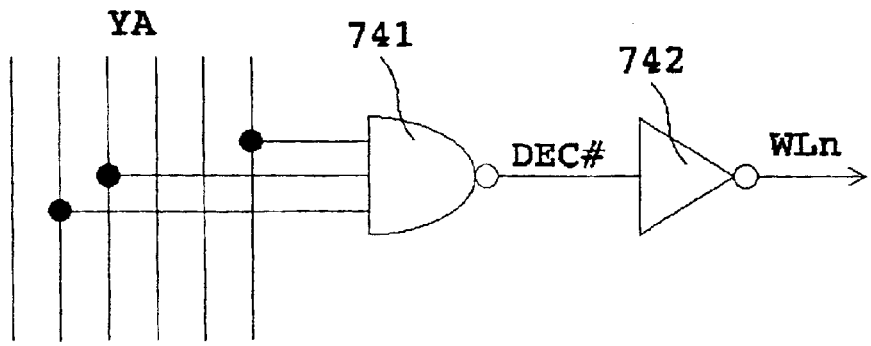

The decoder (715) in FIG. 7(a) comprises a plurality of decoder elements (711). Each decoder element (711) controls one word line. The decoder (715) can be designed in many ways. FIG. 7(d) shows a typical prior art decoder element. This decoder element contains one NAND (741) gate and one inverter (742). The inputs to the NAND gate (741) are connected to a set of word line addresses (YA). The output of the NAND gate (DEC#) is connected to the input of an inverter (742). The output of the inverter (742) is connected to one of the word line (WLn). The decoder element in FIG. 7(d) drives the word line to Vcc only when all of the inputs to the NAND gate (741) are high. Otherwise it drives the word line to Vss. Each decoder element (711) of the decoder (715) has a unique connection to the word line addresses (YA) so that no more than one word line can be activated. Decoders are one of the most commonly used circuitry in the art of circuit design. There are a wide varieties of prior art decoders. Those prior art decoders all share a common property that their outputs are always strongly driven. Using those prior art decoder for 3D IC of the present invention can have problems as described in the following sections.

During the read operation, ideally the voltage on an activated bit line (BL3 for this example) should reach the power supply voltage Vcc. Due to non-ideal effects, its bit line voltage actually reaches a lower voltage (Vbl) as shown in FIG. 7(c). At steady state, this bit line voltage (Vbl) is determined by the current balancing condition between the forward biased diode (701) that should be conducting and the leakage currents of the diodes on the same bit line that should not be conducting. The bit line voltage (Vbl) decreases when the leakage currents of other diodes increase. This is a major problem for poly diodes because they tend to have poor reverse bias properties as shown in FIG. 6. If we use prior art decoder in FIG. 7(d) to control word lines, all the inactive word lines are strongly driven to Vss; the bias voltage on those reverse biased diodes is Vbl, and the leakage currents are determined by the reverse bias properties of those poly diodes. When there is a large number of thin film diodes on a bit line, the total leakage current through those diodes can be so high that the forward biased diode (701) won't be able to provide a detectable bit line voltage (Vbl). Similar problems also can happen elsewhere when there are a large number of diodes connected to the same conductive line. The situation is even worse if one of the diode on the bit line (BL3) is a defective diode (709) as shown by the example in FIG. 7(a). The leakage current through the defective diode (709) maybe strong enough that Vbl can never reach a detectable level when the corresponding word line (WLn for this example) is strongly driven.

One solution to the above problem is to limit the number of diodes on each conductive line. For this reason, the size of the ROM sub-array of the present invention is usually much smaller than that of the prior art ROM. Since each sub-array must have its own peripheral circuits, such as decoders (715), pre-charge circuits (712), and output circuits (714), making sub-array small will increase the total area significantly for prior art ROM devices. That is not the case for 3D ROM of the present invention because we can "hide" peripheral circuits under the diode array. It is therefore possible to have small sub-array without significant increase in device area. The 3-D ROM of the present invention can have multiple layers of bit lines, word lines, and thin film diodes. We only show one layer in this example for simplicity. Multiple layer structures have the same problems that can be solved by the same solutions.

Figure 7E:
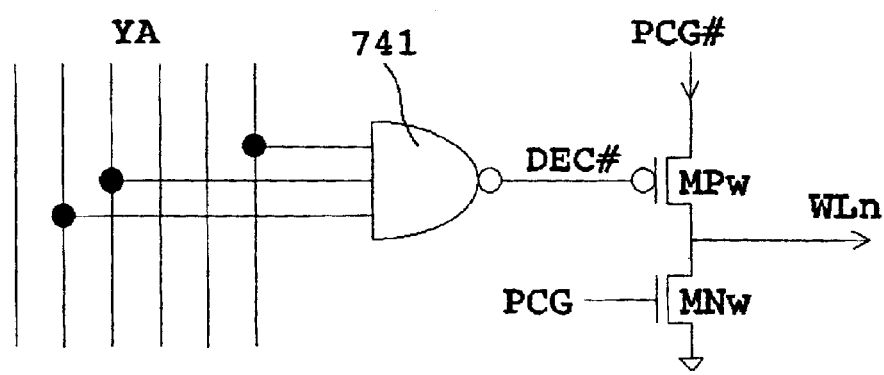

There is another method that can improve the tolerance in non-ideal diode properties without reducing the number of diodes on each conductive line. FIG. 7(e) shows a modified decoder element of the present invention designed for the purpose. This decoder element also has a NAND gate (741) connected in identical ways as the one in FIG. 7(d). The output of the NAND gate (DEC#) is connected to a p-channel transistor (MPw). The source of the p-channel transistor is connected to a signal (PCG#) that is the inverted pre-charge signal (PCG). The drain of MPw is connected to one word line (WLn) and the drain of an n-channel transistor (MNw). The gate of MNw is connected to pre-charge signal PCG, and its source is connected to Vss. When the ROM sub-array is at idle state, where PCG is high and PCG# is low, the word line WLn is always driven to Vss. When the ROM sub-array is activated, where PCG is low and PCG# is high, the word line WLn is activated only when all inputs to the NAND gate (741) are high. When PCG is deactivated while the inputs to the NAND gate are not all high, the word line WLn is at high impedance state because both Mpw and Mnw are turned off. Using the decoder element in FIG. 7(e) to control the word lines, the activated word line is strongly driven to Vcc, while the other word lines are floating. In this way, the reverse bias leakage currents are very small because those reverse biased diodes are all connected to floating word lines. The leakage currents are no longer determined by the non-ideal diode properties. The bit line voltage Vbl is therefore always at (Vcc-Vd) where Vd is the voltage drop roughly between 0.4 volts' and 0.7 volts, even when we are using thin film diodes of poor reverse bias properties. By setting unused word lines at high impedance states, we can improve the tolerance in diode properties. However, if one of the diode is a defective diode with low impedance, there is a different problem. The problem can be illustrated using the example shown in FIG. 7(a). When WL2 is pulled high by the decoder (715), BL3 is pulled high. If the diode connected between BL3 and WLn is a defective diode (709), WLn will be pulled high because its decoder element is floating. When WLn is pulled high, BL1 is also pulled high because it is connected to WLn by a diode (702). BL1 is supposed to stay at Vss when WL2 is activated. The signal on BL1 is therefore wrong. Fortunately, the problem caused by the defective diode (709) in the above example is distinguishable from its timing behavior as illustrated by FIG. 7(c). The last waveform in FIG. 7(c) shows the behavior on BL1 under the above situation. The bit line (BL1) is supposed to stay at Vss all the time. Due to the effect of the defective diode (709), BL1 voltage rises, but the rising rate is much slower than that of a normal bit line (BL3) because BL1 is driven through multiple lines. Eventually BL1 will reach a voltage high enough to cause wrong reading, but we can avoid the problem by turning off the activated word line (WL2) before the voltage on BL1 have time to be fully developed, as shown in FIG. 7(c). As soon as the peak voltage (Vlk) of the erroneous signal is low enough so that the output signals (B1, Bk) are not influenced, the problem can be ignored. On the other word, we can improve the tolerance in non-ideal diode properties by obtaining the correct results before the false results have enough time to cause problems.

Figure 7F:
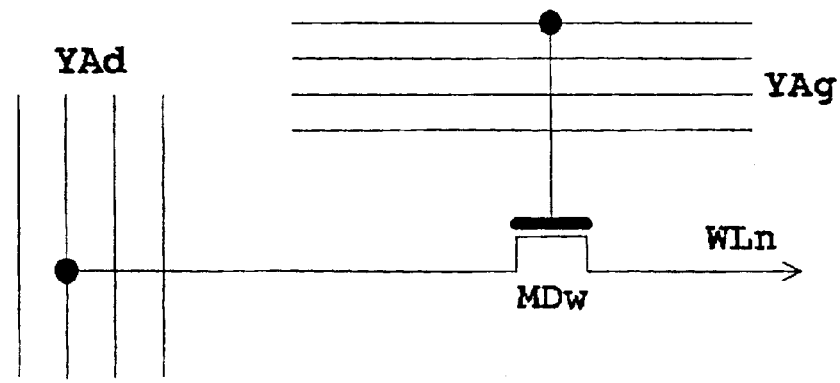

The other method to solve this type of problem is to drive the deactivated word lines with a weak driver, instead of complete floating them. This weak driver will keep the leakage currents of reverse biased diodes low, so that we still have good tolerance on non-ideal diode properties. In the mean time, the weak driver will make it more difficult for the defective diode (709) to propagate the erroneous signal; the tolerance to defective diode is therefore improved. FIG. 7(f) shows a decoder element that has a better tolerance in both types of failure mechanisms described in previous sections. This decoder element contains one depletion mode transistor (MDw). The gate of MDw is connected to one address signal from a set of mutually exclusive gate select signals (YAg). The drain of MDw is connected to one address signal from another set of mutually exclusive drain select signals (YAd). The source of MDw is connected to one word line (WLn). The input connections of each decoder element in the decoder (715) are unique so that no more than one word line can be activated at any time. The threshold voltage (Vt) of this transistor (MDw) is around Vss. When YAg is high, and YAd is high, the word line is stronly driven to Vcc, and the word line is activated. When YAg is high, and YAd is low, the word line is stronly driven to Vss. When YAg is low, and YAd is high, the word line is weakly driven to a small positive voltage roughly at 0.6 volts. When YAg is low, and YAd is low, the word line is weakly driven to Vss because the gate voltage is still around Vt. The logic states of the depletion transistor are listed in Table I. For the example in Table I, we assume that there are 4 mutually exclusive drain select signals (YAd), and 8 mutually exclusive gate select signals (YAg). The last column in Table I list the number of word lines in each state. The table shows that most of the word lines are weakly driven, so that we have better tolerance to the defective diode introduced error. A small fraction (3) of the deactivated word lines are strongly driven to Vss. Since the number is small, the influence in the tolerance of non-ideal diode properties is therefore small. The decoder element in FIG. 7(f) provides the best total tolerance to non-ideal properties of thin film diodes. It also occupies the smallest area because it uses only one transistor for every word line.

TABLE I logic table for the decoder element in FIG. 7(f)

| Yag voltage | Yad voltage | Word line voltage | Driving power | Number of word lines at the state |
|---|---|---|---|---|
| Vcc | Vcc | Vcc | strong | 1 |
| Vcc | Vss | Vss | strong | 3 |
| Vss | Vcc | ~0.6 volts | weak | 7 |
| Vss | Vss | Vss | weak | 21 |

Figure 8:
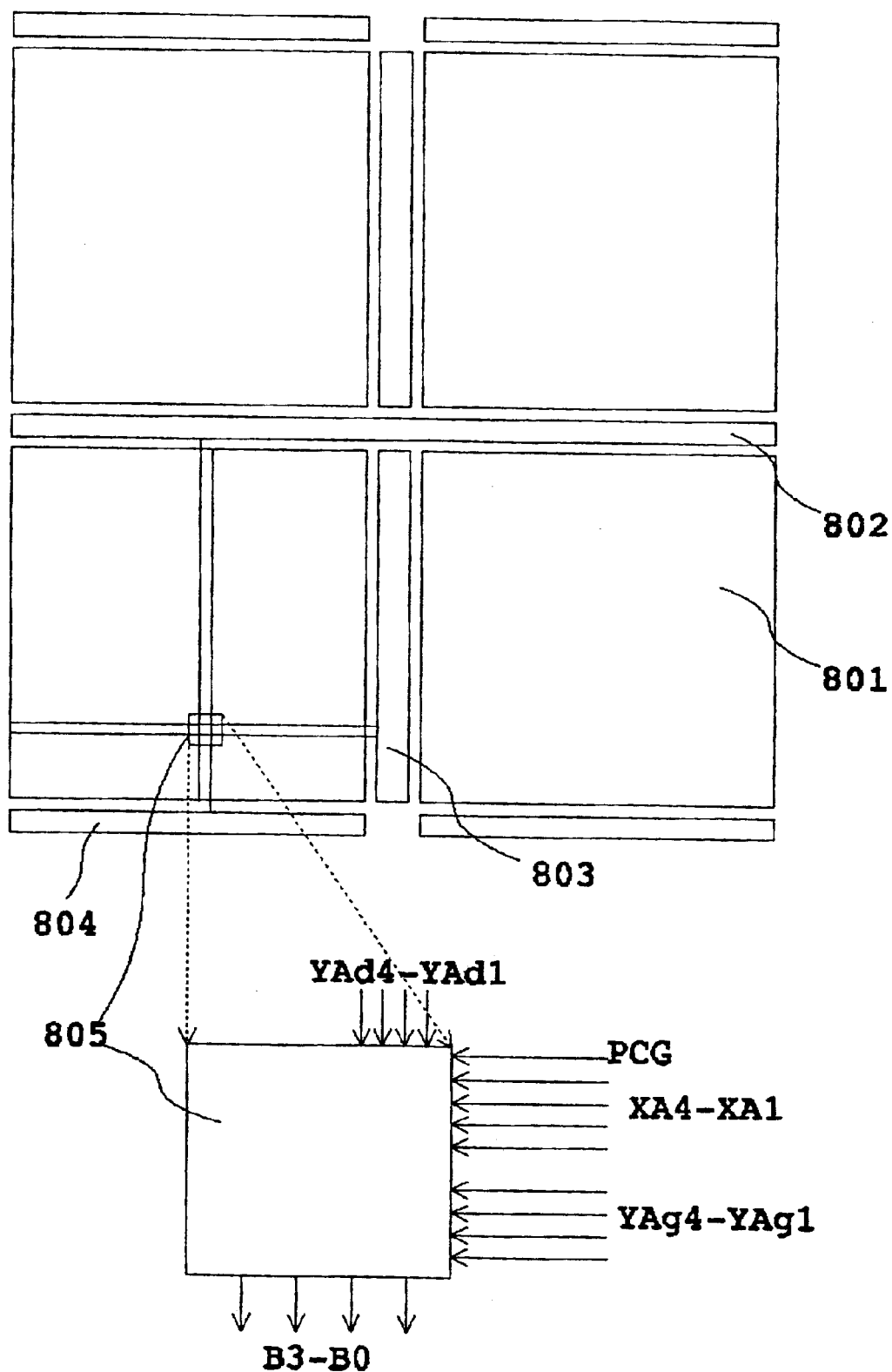
FIG. 8 illustrates high level geometry of a ROM device of the present invention.

FIG. 8 shows the top-level block diagram for a ROM device of the present invention. This ROM device comprises four banks (801) of ROM arrays. Each bank contains a plurality of ROM sub-arrays (805). These sub-arrays (805) have been described in FIG. 7(a), and they are using the decoder elements described in FIG. 7(f). The select signals (XA4–XA1) for the output circuits (714), the gate select signals (YAg4–YAg1) for the decoder (715), and the pre-charge signal (PCG) for those sub-arrays are provides by vertical decoders (803). The drain select signals (YAd4–YAd1) for the decoder (715) in those sub-arrays are provided by horizontal decoders (802). The output signals (B3–B0) from those sub-arrays in the same vertical column are connected together, and sent to sense amplifiers (804) at the boundaries of the ROM device. As apparent from the foregoing, following advantages may be obtained according to ROM device of this invention.

(1) Using multiple layers of thin film diodes, we can achieve unprecedented memory density.
(2) By hiding peripheral circuits under thin film diodes, we are able to use small sub-arrays without increasing total area; both area and power consumption are reduced dramatically.
(3) Novel designs in decoder circuits improve tolerance in non-ideal diode properties.
(4) No p-channel transistors are used in the ROM array; there is no need for Vcc power connection, and there is no n-well in the ROM array.

While specific embodiments of the invention have been illustrated and described herein, it is realized that other modifications and changes will occur to those skilled in the art. It should be understood that the above particular examples are for demonstration only and are not intended as limitation on the present invention. For example, the polarity of diodes or the active voltages of bit lines and word lines can be changes while maintaining the same functionality. Other types of peripheral circuits can replace those particular circuits used in our examples. These and other modifications and changes still fall within the spirit and scope of the invention.

Conventionally, digital signals are distinguished by their voltage levels. For example, one digital value is represented by a voltage higher than Vcc/2, while the opposite digital value is represented by a voltage lower than Vcc/2. In order to improve the tolerance for non-ideal diode properties, we represent digital signals by the current driving power of the signal driver. Full current driving power of the driver represents one digital value, while the opposite value is represented by weak power of the driver. The leakage current of an inactive diode no longer depends on its reverse bias properties. Instead, the leakage depends on the current driving power of the driver that is built from transistors. The ROM decoders have demonstrated this method. The same principle can be applied to many other applications.

As another application example, FIGS. 9(a–g) demonstrates 3D programmable logic array (PLA) of the present invention. FIG. 9(a) is a schematic diagram showing the function and geometry of a PLA using thin film diodes. This PLA actually have many layers of diode arrays. For simplicity, we only show one layer of the diode arrays in FIG. 9(a). In order to limit the number of diodes connected to each conductor line, a PLA of the present invention is often divided into sub-blocks. The example in FIG. 9(a) contains two sub-blocks (901, 911) while actual products can have many sub-blocks. The first sub-block (901) contains two diode arrays. The first diode array (902) is called the "AND array" of the PLA because its function is to execute logic AND operations of its inputs. The AND array of the PLA sub-block (901) contains J pairs of input signals (I1, I1#, I2, I2#, É, Ij, Ij#, É, IJ, IJ#), and K output signals (A1, A2, É, Ak, É, AK), where j, J, k and K are integers. Thin film diodes (900) are selectively placed between the AND array input lines and the AND array output lines to control its logic functions. For the example in FIG. 9(a), A1 is connected to I1, I2 #, and Ij# through diodes. If any one of the connected signals (I1, I2#, Ij#) are low, A1 will be low. On the other word, A1=[I1 AND I2# AND Ij#]. Ak is connected to I2 and IJ# through diodes so that Ak=[I2 AND IJ#], Éetc. The second diode array (903) is called the "OR array" of the PLA because its function is to execute logic OR operations. The OR array of the PLA sub-block (901) contains K input signals (Ab1, Ab2, É, Abk, É, IbK), and I output signals (O1, O2, É, Oi, É, OI), where i, I, k and K are integers. Thin film diodes (909) are selectively placed between the OR array input lines and the OR array output lines to control its logic functions. For the example in FIG. 9(a), O1 is connected to Ab1, Ab2, and Abk through diodes. If any one of the connected signals (Ab1, Ab2, Abk) are high, O1 will be high. On the other word, O1=[Ab1 OR Ab2 OR Abk]. OI is connected to Ab2, Abk and AbK through diodes so that OI=[Ab2 OR Abk OR AK], Éetc. This PLA has J external input signals (IN1, IN2, É, INj, É, INJ), where j and J are integers. These input signals are connected to PLA input circuits (905, 915) in the PLA sub-blocks (901, 911). Details of the PLA input circuits (905) are shown in FIG. 9(b). The PLA input signal (INj) is connected to an inverter (921) to generate an inverted signal INj# that is connected to the gate of an n-channel transistor (MN1). The source of MN1 is connected to the drain of another n-channel transistor (MN3). The drain of MN1 is connected to one PLA AND array input signal (Ij), that is also connected to the drain of a p-channel transistor (MP1). The source of MP1 is connected to power supply voltage Vcc. The gate of MP1 is connected to pre-charge signal PG#, that is also connected to the gate of MN3. The source of MN3 is connected to Vss. The signal INj# is inverted by an inverter (922) before it is connected to the gate of an n-channel transistor (MN2). The source of MN2 is connected to the drain of another n-channel transistor (MN4). The drain of MN2 is connected to the other PLA AND array input signal (Ij#), that is also connected to the drain of a p-channel transistor (MP2). The source of MP2 is connected to Vcc, while the gate of MP2 is connected to the pre-charge signal PG#. The gate of MN4 is also connected to PG#. The source of MN4 is connected to Vss. When the PLA is idle, PG# is low, and this input circuit (905) pulls both Ij and Ij# to power supply voltage Vcc. When the PLA is activated by pulling PG# high, Ij and Ij# are activated; if Inj is high, Ij# is driven to ground voltage Vss while Ij is at high impedance state; if Inj is low, Ij is driven to ground voltage Vss while Ij# is at high impedance state. As discussed in previous ROM application example, setting inactive signal to high impedance states improves the tolerance to non-ideal diode properties. Going back to FIG. 9(a), paired input signals are connected to vertical input lines (I1, I1#, I2, I2#, É, Ij, Ij#, É, IJ, IJ#) of the AND array (902). These AND array input lines intersect horizontal AND array output lines (A1, A2, É, Ak, É, AK). At idle state, the horizontal lines (A1, A2, É, Ak, É, AK) of the AND array are pre-charged to Vcc using p-channel transistors (904) controlled by pre-charge signal PG#. The signal PG# is also connected to a delay circuit (908) to generate OR array pre-charge signals (PG, PG1#). FIG. 9(c) shows the structures of the delay circuit (908, 918). A programmable delay circuitry (925) provides proper delay time, and the output of the delay circuit is connected to an inverter (926) to generate signal PG that is also connected to another inverter (927) to generate signal PG1#. These OR array pre-charge signals (PG, PG1#) control the data converters (907, 917) between AND array and OR array. The structure of the data converter (907, 917) is shown in FIG. 9(d). The AND array output signal (Ak) is inverted by an inverter (923) before connected to the gate of a p-channel transistor (MP5). The source of MP5 is connected to PG1#, while its drain is connected an OR array input line (Abk). Signal Abk is also connected to the drain of an n-channel transistor (MN5). The gate of MN5 is connected to PG, while its source is connected to ground Vss. At idle state, PG1# is low and PG is high so that Abk is always driven to Vss. When the OR array (903) is activated, PG is low and PG1# is high; Abk is driven to Vcc if Ak is high, while it is at high impedance if Ak is low. As discussed in previous ROM application example, setting inactive signal to high impedance states improves the tolerance to non-ideal diode properties.

Figure 9A:
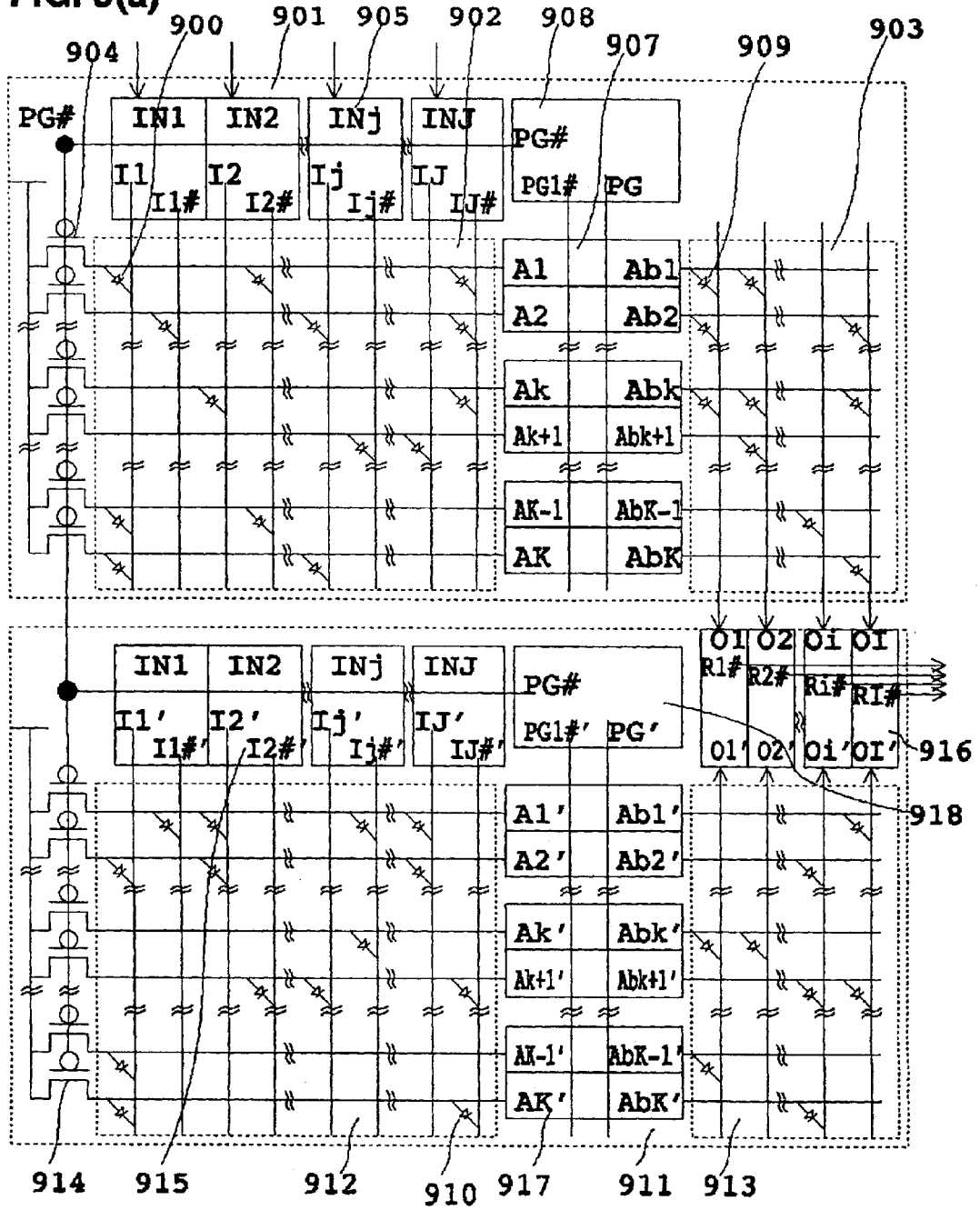
FIGS. 9(a–h) describe the circuit design methods for programmable logic array (PLA) of the present invention.
Figure 9B:
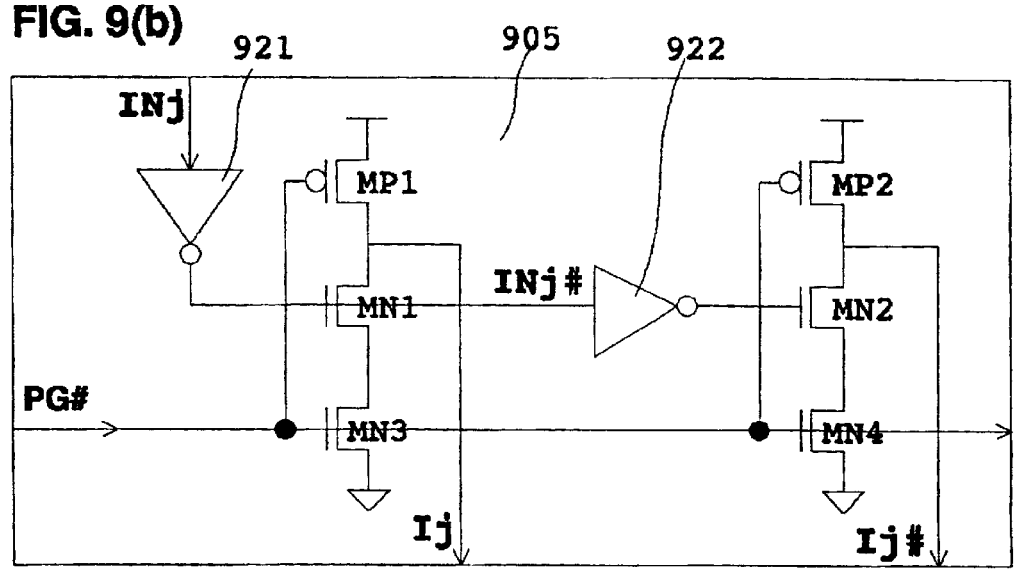
Figure 9C:
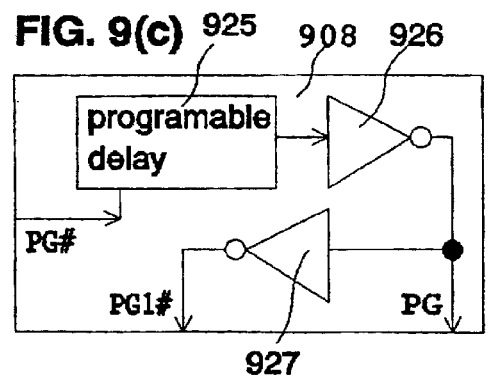
Figure 9D:
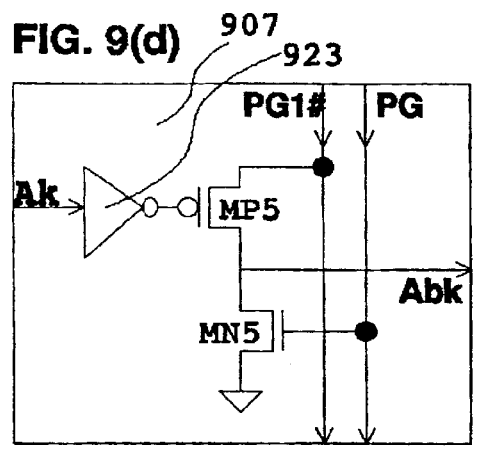
Figure 9E:
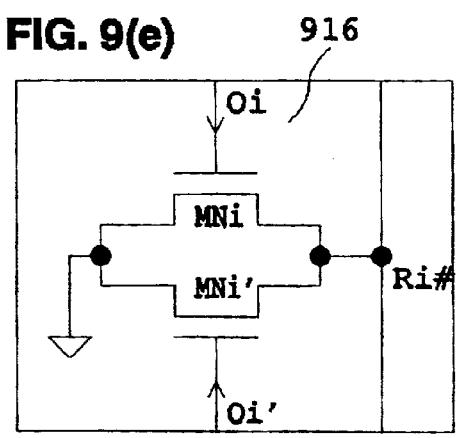
Figure 9F:
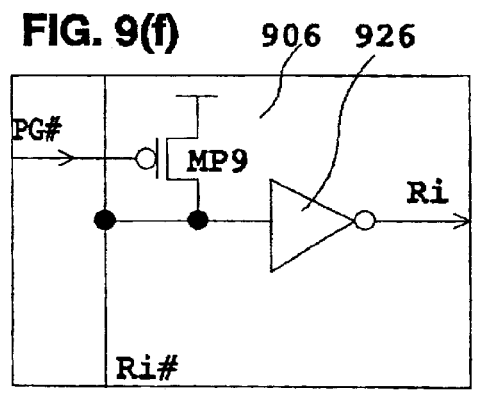

The structure of the second PLA sub-block (911) in FIG. 9(a) is identical to that of the first PLA sub-block (901). The peripheral circuits of the sub-block, including input circuits (915), delay circuits (918), and data converters (917) are all identical to those described in FIGS. 9(b–d). The external input signals (IN1–INJ) are connected to the input circuits (915, 905) of different sub-blocks through high level metal connections (not shown). This sub-block (911) also has its own AND array (912) and OR array (913); diodes in those plans are connected to provide additional logic operations. The resulting OR array (913) outputs (O1'–O1') and those of the first sub-block (O1–O1) are connected to output circuits (916). The structures of the output circuits (916) are shown in FIG. 9(e). The OR array output (Oi) from the first sub-block (901) is connected to the gate of an n-channel transistor (MNi). The corresponding OR array output (Oi') from the second sub-block is connected to the gate of another n-channel transistor (MNi'). The sources of both transistor (MNi, MNi') are connected to Vss. The drains of those two transistors are connected together to a wired-NOR signal (Ri#). These wired-NOR signals (Ri#) are connected to output circuits (916) of many other sub-blocks through high level metal connections (not shown) to the top level output circuit (906) shown in FIG. 9(f). The wired-NOR signal (Ri#) is connected to the drain of a p-channel transistor (MP9), and the input of an inverter (926). The output of the inverter is the final output (Ri) of the PLA. The gate of MP9 is connected to PG#, while its source is connected to Vcc. When the PLA is idle, PG# is low, and Ri is low. When PG# is high, Ri is the OR results of all the OR array outputs (Oi, Oi', É) in different sub-blocks. Therefore, all the sub-blocks are combined together into a complete PLA array.

FIG. 9(g) illustrates the timing waveforms of critical signals for the PLA. Before time Tst, the PLA is at idle state; both PG# and PG1# are low; all the AND array input signals (Ij, Ij#, Ij', Ij#', j=1, É, I) and output signals (Ak, k=1, É, K) are high; all the OR array input signals (Abk, Abk', k=1,É,K) and all the PLA output signals (Ri, i=1, É, I) are low. At time Tst, the AND arrays are activated by pulling PG# high, and some of the AND array output signals (Ak, k=1, É, K) are pulled low depending on the diode connections and the value of PLA input signals. At time Tr in FIG. 9(g), PG1# is pulled high to activate the PLA OR arrays, and the values of the AND array outputs (Abk, Abk') propagate to the OR array to generate PLA outputs (Ri). The PLA outputs (Ri) are valid at time Td in FIG. 9(g). To terminate the PLA operation, PG# is pull down at time Trst, and all the signals return to their idle states at time Te as shown in FIG. 9(g). Again, turning off the PLA shortly after its output is valid helps to improve its tolerance in non-ideal diode properties in similar ways as shown in previous ROM example.

While specific embodiments of the invention have been illustrated and described herein, it is realized that other modifications and changes will occur to those skilled in the art. It should be understood that the above particular examples are for demonstration only and are not intended as limitation on the present invention. For example, the polarity of diodes or the active voltages of AND arrays and OR arrays can be changes into NOR arrays and NAND arrays while maintaining the same functionality. The logic sequence can be changed by executing OR before AND operations, while obtaining the same net results. Other types of peripheral circuits can replace those particular circuits used in our examples. The size and polarity of different sub-blocks can be different. Sub-blocks don't need to have identical peripheral circuits. We can use simple buffers as repeaters to connect different sub-blocks. These and other modifications and changes still fall within the spirit and scope of the invention.

Figure 9H:
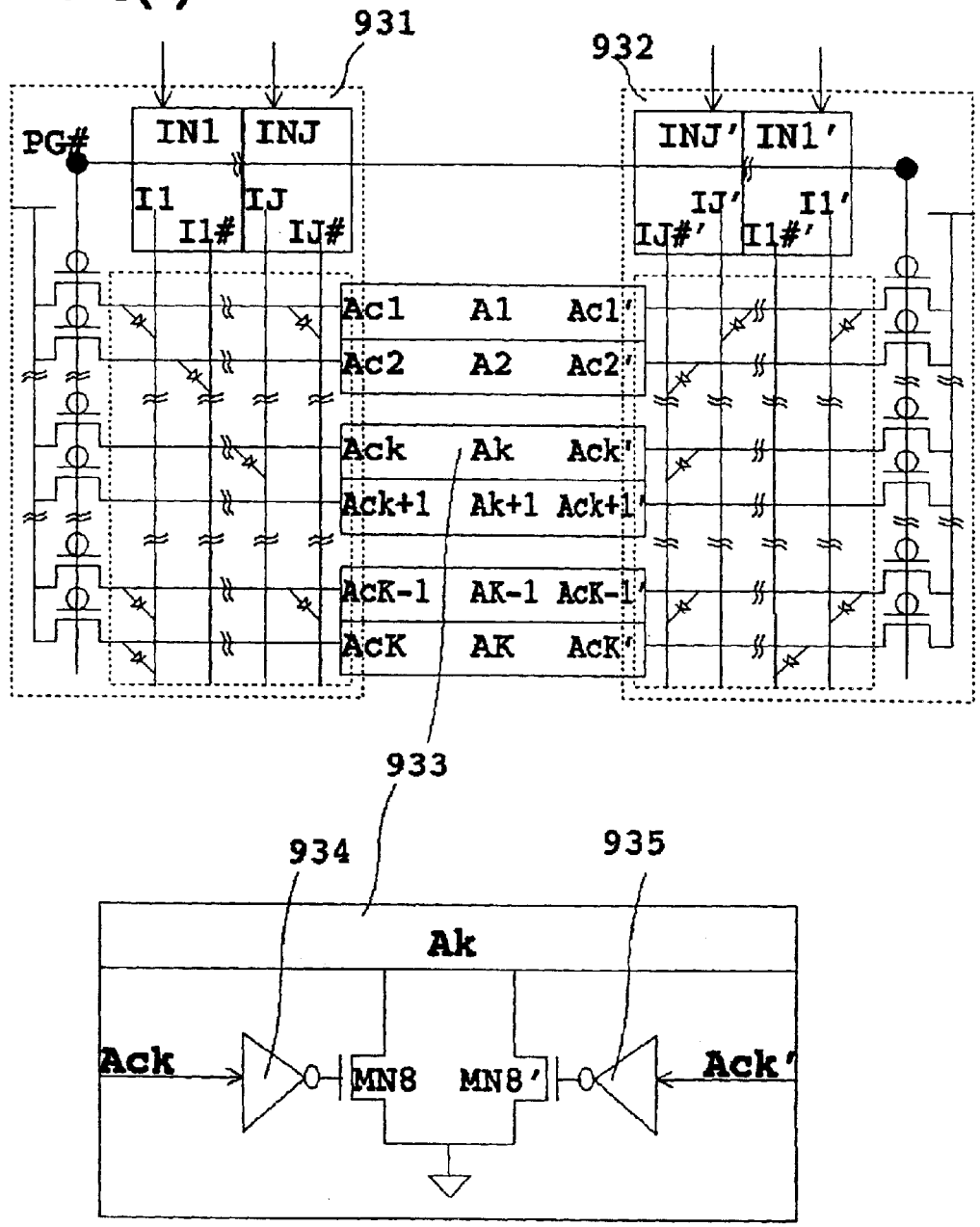

The example in FIG. 9(a) divides PLA into smaller PLA sub-blocks to improve tolerance in non-ideal diode properties. There are other ways to divide the diode arrays. FIG. 9(h) shows a method to divide the AND array of a PLA. The AND array (902) is divided into a plurality of sub-arrays (931, 932). Only two of the sub-arrays are shown in FIG. 9(h) for simplicity. Each sub-array has J pairs of inputs (I1–IJ, I1#–IJ#, I1'–IJ, I1#'–IJ#') and K outputs (Ac1–AcK, Ac1'–AcK'). The outputs of each sub-plans are connected to interface circuits (933). An inverter inverts the out put signal (Ack) from the left sub-plan (931) before it is connected to the gate of an n-channel transistor (MN8). An inverter inverts the out put signal (Ack') from the right sub-plan (932) before it is connected to the gate of another n-channel transistor (MN8'). The sources of both transistors (MN8, MN8') are connected to Vss. The drains of both transistors (MN8, MN8') are connected to the overall output (Ak) of the AND array. The overall output signal (Ak) can connect to the interface circuits (933) of many sub-arrays; when any one sub-array input signal connected with a diode is low, Ak will be low. Therefore, combinations of all the sub-arrays form a complete PLA AND array. The OR array can be divided in similar methods.

Figure 10:
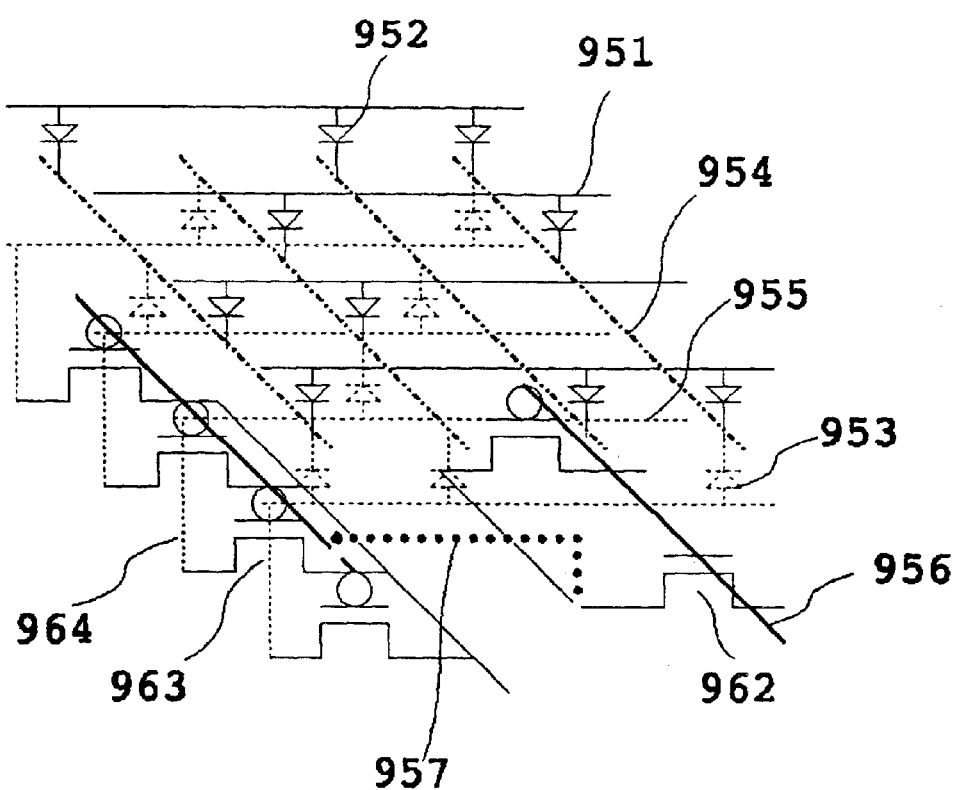
FIG. 10 illustrates the structures of a 3D circuitry of the present invention.

The above PLA and ROM application examples only show one layer of diode arrays while they actually can have many layers of diodes. FIG. 10 is a symbolic diagram illustrating a small portion of a 3D circuitry of the present invention. This circuitry contains two layers of thin film diodes (953, 954) placed on top of MOS transistors (962, 963). The bottom layer diodes (953) drawn in dashed lines are connected between the second layer poly (955) and the third layer poly (954). The top layer diodes (952) are connected between the third layer poly (954) and the forth layer poly (951). In this example, the drain of a p-channel transistor (963) is connected to second layer poly (955) through a poly contact (964). The gates of MOS transistors are connected by the first layer poly (956). A metal line (957) provides connections between the gate of the p-channel transistor (963) and the drain of an n-channel transistor (962) through metal contacts. FIG. 10 is a simplified example demonstrating the device density and the flexibility achieved by the present invention.

As apparent from the foregoing, following advantages may be obtained according to PLA of this invention.
(1) The tolerance in non-ideal diode properties are improved by dividing a PLA into smaller sub-blocks or sub-arrays.
(2) The tolerance in non-ideal diode properties are further improved by digital data representation methods of the present invention.
(3) Both power and performance are improved by dividing a PLA into smaller sub-blocks.
(4) Unprecedented device density is achieved by overlapping multiple layers of thin film diodes with active transistors.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A three dimensional (3D) semiconductor device comprising:
    a) a semiconductor substrate having an upper major surface;
    b) a first polycrystalline silicon diode disposed in said substrate comprising:
        (i) a polycrystalline layer constituting a first electrode of said polycrystalline silicon diode;
        (ii) a conductor layer constituting a second electrode of said first polycrystalline silicon diode,
        (iii) an insulator layer separating said first and second electrodes,
        (iv) an opening in said insulator layer for connecting said first and second electrodes of said first polycrystalline silicon diode, and
    (c) an active semiconductor device comprising a second diode disposed in said substrate and overlapping in a vertical direction with said first polycrystalline silicon diode stacking in a common overlapping surface area under said upper major surface.

2. The three dimensional (3D) semiconductor device of claim 1 wherein:
    said second diode further comprising (a) a first polycrystalline semiconductor layer constituting a first electrode of said second diode,
    said second diode further comprising (a) a second polycrystalline semiconductor layer constituting a second electrode of said second diode,
    said second diode further comprising (c) an insulator layer separating said first and second electrodes of said second diode, and
    said second diode further comprising (d) openings in said insulator layer for connecting said first and second electrodes of said second diode;
    wherein said first and second electrodes of said second diode have dopants of opposite conductivity.

3. The three dimensional (3D) semiconductor device of claim 1 wherein:
    said second diode further comprising (a) a first polycrystalline semiconductor layer constituting a first electrode of said second diode,
    said second diode further comprising (b) a metal layer constituting a second electrode of said second diode,
    said second diode further comprising (c) an insulator layer separating said first and second electrodes of said second diode, and
    said second diode further comprising (d) openings in said insulator layer for connecting said first and second electrodes of said second diode.

4. The three dimensional (3D) semiconductor device of claim 1 wherein:
    said insulator layer of said first polycrystalline diode and said second diode further comprising a layer of tunneling insulator grown between said first and second electrodes of said first polycrystalline diode and said second diode wherein a thickness of said tunneling insulator is between $1 \times 10^{-9}$ to $3 \times 10^{-9}$ meters.

5. A three dimensional (3D) semiconductor device comprising:
    a) a semiconductor substrate having an upper major surface;
    b) a polycrystalline silicon diode disposed in said substrate comprising:
        (i) a polycrystalline layer constituting a first electrode of said polycrystalline silicon diode;
        (ii) a conductor layer constituting a second electrode of said polycrystalline silicon diode,
        (iii) an insulator layer separating said first and second electrodes,
        (iv) an opening in said insulator layer for connecting said first and second electrodes of said polycrystalline silicon diode,
    wherein said insulator layer of said polycrystalline diode further comprising a layer of tunneling insulator grown between said first and second electrodes of said polycrystalline diode and said second diode wherein a thickness of said tunneling insulator is between $1 \times 10^{-9}$ to $3 \times 10^{-9}$ meters; and
    (c) an active semiconductor device comprising a metal-oxide-silicon (MOS) transistor disposed in said substrate and overlapping in a vertical direction with said polycrystalline silicon diode stacking in a common overlapping surface area under said upper major surface.

6. An active integrated circuit (IC) device formed in a semiconductor substrate having an upper major surface comprising:
    at least two thin-film sub-micron diodes disposed in said substrate wherein said thin-film sub-micron diodes vertically stacking over each other under an common overlapping area of said upper major surface.

7. The active integrated circuit (IC) device of claim 6 wherein:
    said thin-film sub-micron diodes partially overlapping over each other with an upper thin-film sub-micron diode stacking partially over a lower thin-film sub-micron diode under a common partially overlapping area of said upper major surface.

8. An active integrated circuit (IC) device formed in a semiconductor substrate having a diode comprising:
    a first polycrystalline semiconductor layer constituting a first electrode;
    a metal layer constituting a second electrode; and
    wherein said diode further includes a layer of tunneling insulator grown between said first and second electrodes wherein a thickness of said tunneling insulator is between $1 \times 10^{-9}$ to $3 \times 10^{-9}$ meters.

* * * * *